United States Patent
Kawamura et al.

(10) Patent No.: US 8,605,512 B2
(45) Date of Patent: Dec. 10, 2013

(54) NONVOLATILE SEMICONDUCTOR MEMORY DEVICE AND METHOD OF OPERATING A NONVOLATILE MEMORY DEVICE

(75) Inventors: Shoichi Kawamura, Yokohama (JP); Tomohisa Miyamoto, Yokohama (JP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 168 days.

(21) Appl. No.: 13/329,372

(22) Filed: Dec. 19, 2011

(65) Prior Publication Data

US 2012/0155180 A1      Jun. 21, 2012

(30) Foreign Application Priority Data

Dec. 20, 2010   (JP) .................................. 2010-283127

(51) Int. Cl.
*G11C 11/40*      (2006.01)

(52) U.S. Cl.
USPC ............ 365/185.24; 365/185.09; 365/185.17; 365/185.18; 365/185.22; 365/185.29; 365/184; 365/200

(58) Field of Classification Search
USPC ............ 365/185.09, 185.17, 185.18, 185.22, 365/185.24, 185.29, 184, 200
See application file for complete search history.

(56) References Cited

U.S. PATENT DOCUMENTS

| 5,691,941 | A | 11/1997 | Imamiya et al. |
| 2003/0214853 | A1* | 11/2003 | Hosono et al. ................ 365/200 |
| 2007/0103980 | A1* | 5/2007 | Koebernick et al. ..... 365/185.09 |
| 2010/0238701 | A1* | 9/2010 | Tsukamoto et al. .......... 365/148 |

FOREIGN PATENT DOCUMENTS

JP           08-153398        6/1996

* cited by examiner

*Primary Examiner* — Hoai V Ho
*Assistant Examiner* — Jay Radke
(74) *Attorney, Agent, or Firm* — Volentine & Whitt, PLLC

(57) ABSTRACT

A nonvolatile memory device includes a memory cell array including a plurality of bitlines, a plurality of wordlines, and a plurality of memory cells. The memory device further includes a plurality of page buffers coupled to the respective bitlines of the memory cell array, each page buffer including a latch configured to store data to be written into and read from a memory cell coupled to a respective bitline of the memory cell array. The memory device further includes a control circuit configured to execute an over-program verify operation which includes detecting an over-programmed memory cell among the plurality of memory cells with reference to pass/fail data stored in the respective latches of the plurality of page buffers, and decreasing a threshold voltage of a detected over-programmed memory cell while maintaining a threshold voltage of memory cells which have not been detected as being over-programmed.

14 Claims, 12 Drawing Sheets

Fig. 3

| Operation Mode | Block Sel/Unsel | BLKSEL | GSSL | GSGL | GWL | SSL | SGL | WL Selected Word, Non-selected Word | NARS |
|---|---|---|---|---|---|---|---|---|---|
| Write | Selected Block | >Vpgm+Vt | VL | 0V | Vpgm, or Vpass | VL | 0V | Vpgm or Vpass | 0V |
| | Unselected Block | 0V | ← | ← | ← | 0V | Floating | Floating | |
| Erase Stress | Selected Block | Vpass | Vpass | Vpass | ALL 0V | Floating | Floating | ALL 0V | 0V |
| | Unselected Block | 0V | ← | ← | ← | Floating | Floating | Floating | |
| Write Verify /Read | Selected Block | >Vpass+Vt | Vpass | Vpass | 0V, or Vpass | Vpass | Vpass | 0V or Vread | 「H」Level |
| | Unselected Block | 0V | ← | ← | ← | 0V | Floating | Floating | |
| Erase Verify | Selected Block | >Vpass+Vt | Vpass | Vpass | ALL 0V | 0V | Vpass | All 0V | 「H」Level |
| | Unselected Block | 0V | ← | ← | ← | 0V | Floating | Floating | |

Fig. 5

| | PLOAD | LCH | COPY | PBSLT | BLSHF | SHLD | External DATA | /DI | L0 | L1 | BL | Word Select | Non Select | Cell DATA | BL | L0 | L1 | /RDI | External DATA | COMMENT |
|---|---|---|---|---|---|---|---|---|---|---|---|---|---|---|---|---|---|---|---|---|
| Write | L | H | | H | H | H | 0<br>1 | H<br>L | L<br>H | L<br>L | L<br>H | Vpgm<br>↓ | Vpass<br>↓ | 0(OFF Cell)<br>1(ON Cell) | | | | | | RESET_STATE<br>(INHIBIT) |
| Write-Verify (Verify1) | L | H<br>H<br>H | | | H | H | | | | | H | 0V<br>↓<br>↓ | Vread<br>↓<br>↓ | 0_Fail<br>0_Pass<br>1 | L<br>H<br>H | H<br>L<br>H | L<br>H<br>L | L<br>LCH<br>LCH | | WriteVerify_Fail<br>WriteVerify_Pass<br>WriteVerify_Pass |
| Read | L | H<br>H | H | | | H | | | | | H | 0V<br>↓<br>↓ | Vread<br>↓<br>↓ | 0_Pass<br>0_Fail<br>1 | H<br>L<br>H | L<br>H<br>L | H<br>L<br>H | L<br>L<br>L | 0<br>1<br>1 | RESET_STATE<br>Read_Pass<br>Read_Fail<br>Read_Pass |
| Erase_Verify | L | H<br>H<br>H | | | H | H | | | | | H | 0V<br>↓<br>↓ | 0V<br>↓<br>↓ | 0(OFF Cell)<br>1(ON Cell) | L<br>H<br>L | L<br>L<br>H | L<br>H<br>L | L<br>H | | RESET_STATE<br>Erase_Fail<br>Erase_Pass |
| Over Write-Verify (Verify2) | L | H<br>H<br>H | | H<br>H<br>H | H | H | | L<br>H<br>H | H<br>L<br>H | L<br>L<br>L | L | >Vread<br>↓<br>↓ | Vread<br>↓<br>↓ | 0(OW Cell)<br>1 | H<br>L<br>L | L<br>H<br>L | L<br>L<br>H | H<br>L<br>L | | RESET_STATE<br>Pass<br>Fail<br>Fail |
| CURE | L | | | | H | | | | | | | Vneg<0V<br>↓ | Vpass<br>↓ | 0<br>0<br>1 | | | | | | Vt↓(Weak Erase)<br>No Stress<br>No Stress |
| Copy | L | H<br>H | H<br>H | | H | H | | | | | | 0V<br>↓ | Vread<br>↓ | 0<br>1 | L<br>H<br>L | H<br>H<br>L | L<br>L<br>H | | | RESET_STATE<br>Cell→LATCH for W-Verify |

NONVOLATILE SEMICONDUCTOR MEMORY DEVICE AND METHOD OF OPERATING A NONVOLATILE MEMORY DEVICE

CROSS-REFERENCE TO RELATED APPLICATIONS

A claim of priority under 35 U.S.C. §119 is made to Japanese Patent Application No. 2010-283127, filed on Dec. 20, 2010, the disclosure of which is hereby incorporated by reference in its entirety.

BACKGROUND OF THE INVENTION

The inventive concepts described herein relate to nonvolatile semiconductor memory devices.

During a data read operation, a large-capacity nonvolatile memory device, such as electrically erasable and programmable read only memory (EEPROM), reads data from memory cells in the unit of pages and serially outputs the read data. During a data write operation, the large-capacity memory device serially receives the data in the unit of one page and writes the received data into memory cells in the unit of pages. In order to perform these data read and write operations, a plurality of row lines, i.e., bitlines are connected to a page buffer including a data latch configured to temporarily latch read data and data to be written.

Data writing of a NAND-type EEPROM is performed with respect to a memory cell included in one bank, among a plurality of memory cells arranged in a matrix of rows and columns. Conventionally, a memory cell of a NAND-type EEPROM is a floating gate-type N-channel MOS transistor. Such a MOS transistor is disposed within a P-well formed on one surface portion of a semiconductor substrate. Floating gate-type N-channel MOS transistors are spaced apart from each other in the P-well.

A floating gate-type N-channel MOS transistor includes source and drain regions, a tunnel oxide layer disposed on a channel region between the source and drain regions, a polysilicon floating gate disposed on the tunnel oxide layer, and a control gate disposed on the floating gate with a dielectric insulator interposed therebetween.

Memory cells in one column are serially connected to constitute a NAND cell string. A first selection transistor is disposed between one end of the NAND cell string and a bitline, and a second selection transistor is disposed between the other end of the NAND cell string and a common source line.

In a data write operation, when data "0" is written while turning on the first selection transistor and turning off the second selection transistor, a voltage of 0 volt is supplied to a bitline. On the other hand, when data "1" is written (e.g., an erase state is maintained), a power supply voltage VCC is supplied to the bitline.

Additionally, a program voltage Vpgm (e.g., 18 volts) is supplied to a wordline WL of a selected memory cell, and a program inhibit voltage Vpass (e.g., 9 volts) is supplied to a wordline WL of an unselected memory cell.

Thus, in a memory cell into which the data "0" is to be written, a voltage is applied between a channel and a control gate to introduce electrons into the floating gate from the channel and a threshold voltage of the memory cell shifts in a positive direction, for example, from a negative voltage to a positive voltage.

On the other hand, in a memory cell into which the data "1" is to be written, a relatively lower voltage is applied between the channel and the control gate to suppress introduction of electrons into the floating gate and the threshold voltage of the memory cell is maintained, for example, in a negative voltage state.

As described above, a NAND-type EEPROM relies on tunnel current to write data. Further, even though write times of all the memory cells are equal to each other, and data write speeds can vary based on the number of memory cells being written.

Ideally, the threshold voltage of a programmed memory cell (e.g., a "0" memory cell) is properly between 0 volt and a predetermined voltage (e.g., 5 volts). In practice, however, the threshold voltage of one or more memory cells may exceed the predetermined voltage. These memory cells are referred to below as over-programmed memory cells.

In a NAND-type EEPROM, during a data read operation, a memory cell becomes an ON-cell by applying the predetermined voltage (hereinafter referred to "read voltage Vread") to a wordline WL of an unselected memory cell. However, when a threshold voltage of an over-programmed memory cell is higher than the predetermined voltage, the memory cell is maintained at an OFF-cell state. Accordingly, since a current path of a NAND cell string is blocked by the memory cell, data of all memory cells included in a NAND cell string connected in series to the memory cell cannot be read.

For this reason, there have been proposed methods of configuring data writing from the same cycle as a data setting operation for a data write operation, a write verify operation, and a rewrite operation. In a memory cell whose threshold voltage sufficiently rises due to the write verify operation, rewrite data (data "1") is set to a data latch of a page buffer such that data "0" is not written in the next cycle.

However, in a one-time data write operation (following a first or second data write operation), there may be a case where a threshold voltage of a selected memory cell rises to exceed the predetermined voltage. In this case, in a verify operation, it is determined that data "0" is properly written into the selected memory cell, even though the memory cell may have a threshold voltage which exceeds the afore-mentioned predetermined voltage (i.e, an over-programmed memory cell"). When there is an over-programmed memory cell at a NAND cell string, data of another memory cell connected in series to the over-program memory cell cannot be read, as described above.

SUMMARY OF THE INVENTION

According to some embodiments of the inventive concepts, a nonvolatile memory device is provided which includes a memory cell array including a plurality of bitlines, a plurality of wordlines, and a plurality of memory cells. The memory device further includes a plurality of page buffers coupled to the respective bitlines of the memory cell array, each page buffer including a latch configured to store data to be written into and read from a memory cell coupled to a respective bitline of the memory cell array. The memory device further includes a control circuit configured to execute an over-program verify operation which includes detecting an over-programmed memory cell among the plurality of memory cells with reference to pass/fail data stored in the respective latches of the plurality of page buffers, and decreasing a threshold voltage of a detected over-programmed memory cell.

According to other example embodiments of the inventive concepts, a method of operating a nonvolatile memory device is provided. The nonvolatile memory device including memory cell array including a plurality of bitlines, a plurality of wordlines, and a plurality of memory cells, and a plurality of page buffers coupled to the respective bitlines of the memory cell array, each page buffer including a latch configured to store data to be written into and read from a memory cell coupled to a respective bitline of the memory cell array. The method includes executing a write operation in which write data is latched into the respective latches of the page buffers, and then stored in memory cells of bitlines coupled to the pages buffers, executing a write verify operation to verify proper execution of the write operation, the write verify operation including latching the write data stored in the memory cells into the latches of the page buffers, executing an over-write verify operation to determine whether the write data subjected to the write verify operation is over-programmed write data, the over-write verify operation including reading pass/fail data stored in the latch circuits of the page buffers, and executing a cure operation in which a threshold voltage of a detected over-written memory cell is reduced while a threshold voltage of memory cells which have not been detected as an over-written memory cell is maintained.

BRIEF DESCRIPTION OF THE DRAWINGS

The inventive concepts will become apparent from the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the inventive concepts.

FIG. 3 illustrates examples of voltage levels of signals that the column decoder and a switch shown in FIG. 2 output in respective operation modes with respect to a selected block or an unselected block.

FIG. 5 is a table illustrating examples of states of connection points of a latch shown in FIG. 3 during a read operation of data stored in a nonvolatile memory cell.

DETAILED DESCRIPTION

The inventive concept will now be described more fully hereinafter with reference to the accompanying drawings.

Figure 1:
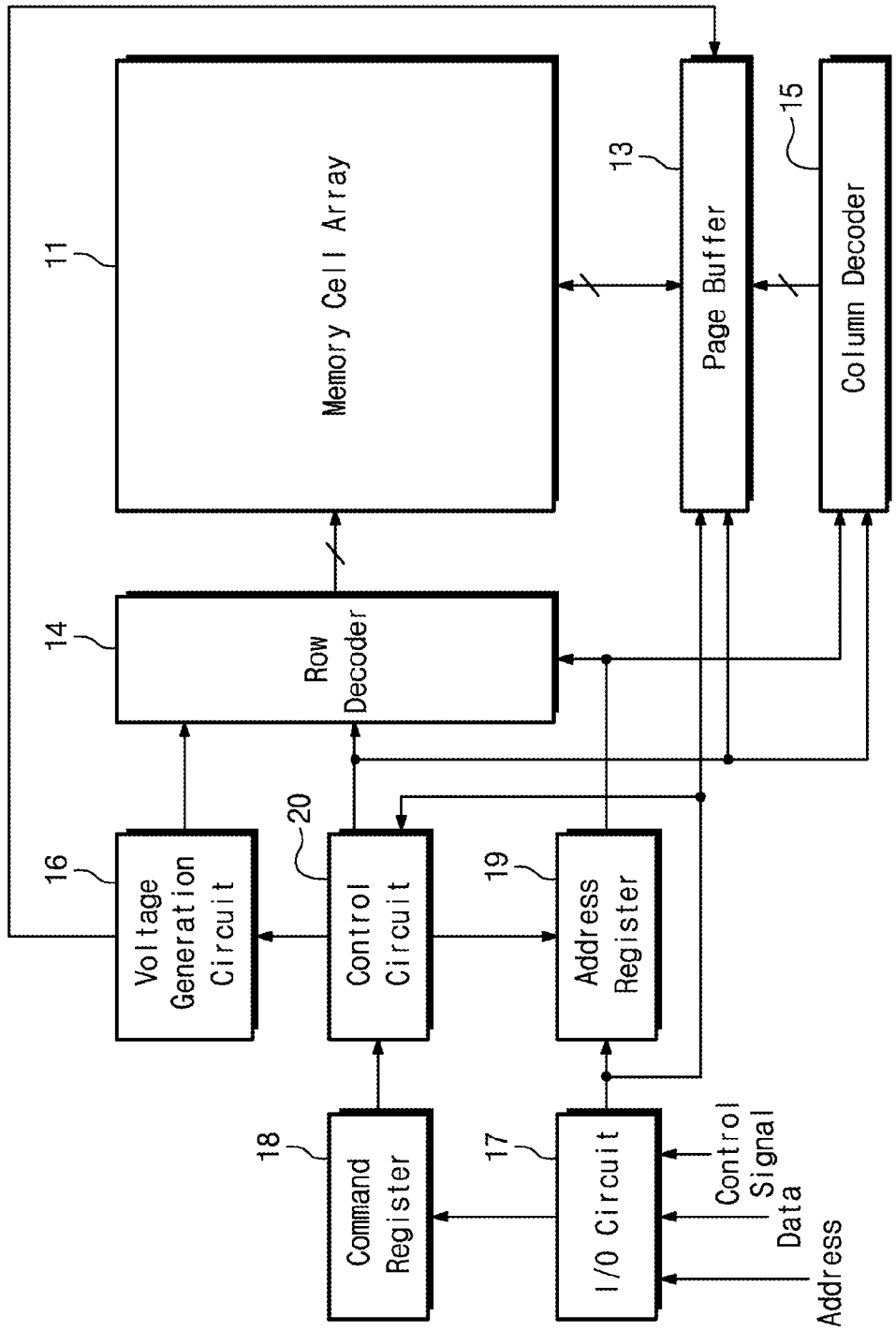
FIG. 1 is a block diagram illustrating an example of a nonvolatile memory device according to an embodiment of the inventive concept.
Figure 2:
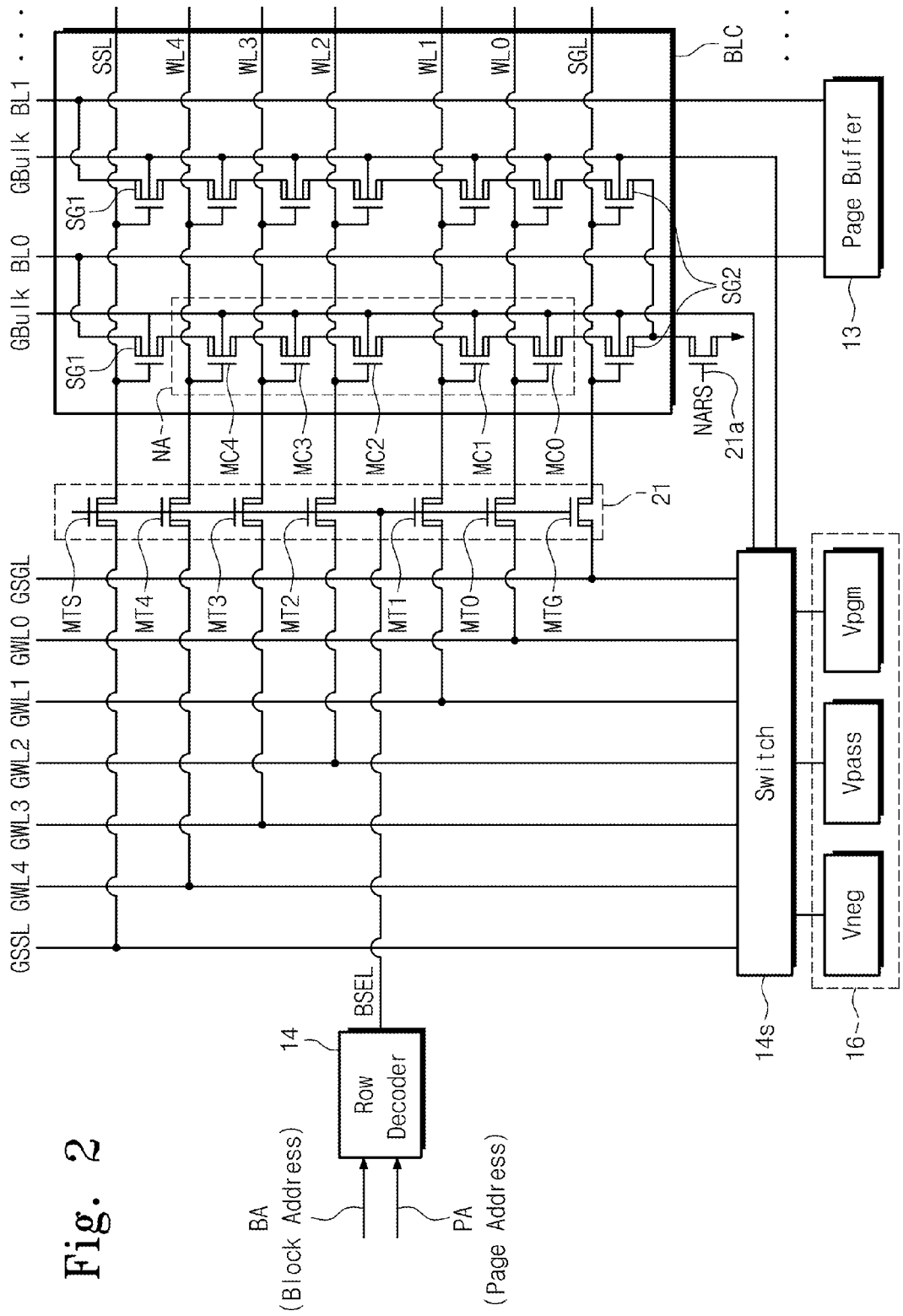
FIG. 2 illustrates an example of a memory cell array, a column decoder, a voltage generation circuit, and a page buffer group shown in FIG. 1.

FIG. 1 is a block diagram illustrating an example of a NAND-type EEPROM that constitutes a nonvolatile memory device according to an embodiment of the inventive concept. FIG. 2 illustrates an example of a some of the components shown in FIG. 1, including a block BLC of the memory cell array 11, a page buffer group 13, a row decoder 14, and a voltage generation circuit 16.

Referring to these figures, the voltage generation circuit 16 includes a plurality of voltage generation circuits (e.g., Vneg, Vpass, Vpgrm) arranged in an interconnection direction of a bitline. Although only one voltage generation circuit 16 is shown in FIG. 2, it is noted that voltage generation circuit 16 may be provided for each memory block BLC, and that the memory cell array 11 may include $2^j$ blocks BLC (j being the bit number of a block address BA).

The memory cell block BLC, which denotes a data erase unit of the memory cell array, includes NAND cell strings NA each made up of serially connected floating gate transistors, i.e., electrically rewritable nonvolatile memory cells MC0-MC4. Although five memory cells MC0-MC4 are shown in the example of FIG. 2, the number of the memory cells is merely exemplary and the NAND cell string NA may include $2^h$ serially connected nonvolatile memory cells MC (h being a bit number of a page address PA).

The NAND cell string NA is arranged in a row direction with respect to the memory cell array 11 and with respect to each of bitlines BL0-BL1. Although only two bitlines are shown in FIG. 2, the number of the bitlines is merely exemplary. Conventionally, the number of bitlines is determined by a bit number of an externally input column address and a bit number of externally input data.

Wordlines WL0-WL4, extending perpendicular to the bitlines BL0-BL1, are connected to gates of the nonvolatile cells disposed on the same row, respectively. Again, the number of wordlines is merely presented by way of example.

A selection transistor SG1 is disposed between one end of a bitline BL and one end of the NAND-type cell string NA to connect or disconnect these ends of the bitline BL and the NAND-type cell string NA.

A selection transistor SG2 is disposed between one end of a common source line CSL and the NAND-type cell string NA to connect or disconnect these ends of the bitline BL and the NAND-type cell string NA.

In this example, the selection transistors SG1 and SG2 are N-channel MOS transistors. Gate electrodes of the selection transistors SG1 and SG2 are connected to selection gate signals SSL and SGL disposed in parallel with the wordlines WL.

A MOS transistor 21a is disposed between the common source line GSL and a ground to be connected to or disconnected from a selection signal NARS.

When data is read from the nonvolatile memory cell MC, the selection gate signals SSL and SGL and the selection signal NARS become high (H level). Accordingly, one end of the NAND cell string NA is connected to the bitline BL and the other end thereof is grounded.

When data is written into the nonvolatile memory cell MC, the selection gate signals SSL and SGL become high (H level) and the selection signal NARS becomes low (L level). Accordingly, a channel of the NAND cell string is precharged by a voltage supplied to the bitline BL from a page buffer PB.

A cell transistor (nonvolatile memory cell MC) has a threshold voltage corresponding to retained data. In the case of a single level cell NAND-type EEPROM, a state that a cell transistor is depressed (D-type) is conventionally defined as a data "0" retention state (erase state) of data "1" and a state that a cell transistor is enhanced (E-type) is conventionally defined as a data "1" retention state (write state).

In a write operation, a threshold voltage of a cell transistor retaining data "1" shifts in a positive direction to retain data "0". In an erase operation, a threshold voltage of a cell transistor retaining data "0" shifts in a negative direction to retain data "1".

Still referring to FIGS. 1 and 2, the page buffer group 13 includes a plurality of page buffers PB provided in respective bitlines BL to write and read data in the unit of pages. Each page buffer PB of the page buffer group 13 is connected to a bitline and includes a latch circuit which functions as a sense amplifier circuit configured to amplify and sense a voltage of the connected bitline.

The row decoder 14 selects a wordline WL of the memory cell array 11, while the column decoder 15 selects a bitline BL and a page buffer PB of the memory cell array 11. Also, as mentioned above, the voltage generation circuit 16 generates various voltages used to rewrite, erase, and read a nonvolatile memory cell MC.

An input/output (I/O) circuit 17 outputs an externally supplied address to an address register 19, outputs command data indicating an externally supplied command to a command register 18, and outputs an externally input control signal to a control circuit 20. In addition, the I/O circuit 17 outputs externally input data to each page buffer of the page buffer group 13 or outputs data read from the nonvolatile memory cell MC through the page buffer group 13 to an external device (such as a host device or memory controller).

The address register 19 retains an address input from the I/O circuit 17 and outputs the retained address to the row decoder 14 and the column decoder 15. The command register 18 retains command data expressed by the command data input from the I/O circuit 17.

The control circuit 20 controls data write, read, erase, and verify operations of the nonvolatile memory cell MC according to a control signal input from the I/O circuit 17 and a command data supplied from the command register 18.

As examples, the control signal 20 may be an external clock signal, a chip enable signal, a command latch enable signal, an address latch enable signal, a write enable signal, a read enable signal or the like. The control circuit 20 outputs an internal control signal to each circuit according to an operation mode in which command data is indicated by such a control signal.

The control circuit 20 determines whether data is successfully written or erased (PASS), with reference to data stored in latches of the page buffers of the page buffer group 13.

In operation, the row decoder 14 decodes a block address BA retained by the address register 19 and outputs a block selection signal BLKSEL, as a decoding result, to a gate of a transfer transistor group 21 provided at each voltage generation circuit 16.

A voltage level of the block selection signal BLKSEL is a voltage level of a voltage generated when the control circuit 20 controls the voltage generation circuit 16. This voltage level becomes a voltage level corresponding to a selected block or an unselected block in each operation mode.

As shown in FIG. 2, the transfer transistor 21 includes N-channel MOS transistors MT0-MT4, MTS, and MTG and is provided to correspond to each voltage generation circuit 16.

The row decoder 14 decodes a page address PA retained by the address register 19, and supplies a voltage supplied through a switch 14s, as a decoding result, to internal word signals GWL0-GWL4 and commonly outputs these signals to drains of the transistors MT0-MT4 of the transfer transistor group 21.

Moreover, the row decoder 14 supplies the voltage supplied through the switch 14s to internal selection gate signals GSSL and GSGL and commonly outputs these signals to drains of the transistors MTS and MTG of the transfer transistor group 21.

In this case, a voltage level of the internal word signal GWL and the internal selection gate signals GSSL and GSGL is a voltage level of a voltage generated when the control circuit 20 controls the voltage generation circuit 16. This voltage level becomes a voltage level corresponding to each operation mode.

A transfer transistor group 21, provided to correspond to memory cell blocks BLC, transfers the output of the column decoder 14 according to the voltage level of the block selection signal BLKSEL. A voltage level corresponding to an operation mode is supplied to the selection gate signals SSL and SGL and the wordlines WL0-WL4 respectively connected to a plurality of NAND cell string gates of the memory cell block BLC.

FIG. 3 shows voltage levels of signals respectively input to selected and unselected blocks in each operation mode among blocks BLC to which a voltage is supplied from the row decoder 14 having the above-described configuration. Hereinafter, a selection operation of a selected block and an unselected block in each operation mode will be described below. First, a write verify operation will be described below.

Block Selection in Write Verify Operation

In a write operation mode (data write operation), a row decoder 14 outputs a block selection signal BLKSEL to a transfer transistor group 14 of one memory cell block BLC (hereinafter referred to as a selected memory cell block BLC) among a plurality of memory cell blocks BLC with reference to a block address BA. The block selection signal BLKSEL has a voltage level that is higher than a level of a program voltage Vpgm by a threshold voltage Vt of a transfer transistor of the transfer transistor group 21. The row decoder 14 outputs a block selection signal BLKSEL of 0 volt to the other memory blocks BLC (hereinafter referred to as unselected memory blocks BLC).

Thus, an output of a switch 14s is input to only the selected memory block BLC.

Moreover, a selected gate signal SSL input to the unselected voltage generation circuit 16 is fixed to a voltage of 0 volt by an N-channel MOS transistor (MTN in FIG. 2) having a gate to which a logical inverted signal /BLKSEL of the block selection signal BLKSEL output by the row decoder 14 is input.

Voltage levels of a selected gate signal SGL and wordlines WL0-WL4 input to the unselected memory cells blocks BLC each become a floating voltage for turning off each transfer transistor group 21.

The switch 14s outputs an internal word signal GWL having a voltage level of a write inhibit voltage Vpass, an internal selection gate GSSL having a voltage level of a low voltage VL (power supply voltage VCC or less), and an internal selection gate signal GSGL of 0 volt to each transfer transistor 21 of the selected memory block BLC.

Since the transfer transistor 21 of the selected memory cell block BLC remains in an ON state, voltage levels of the selected gate signals SSL and SGL and the wordlines WL0-WL4 input to the selected memory cell block BLC each have the same voltage level as a signal that the switch 14s outputs.

A control circuit 20 makes a selection signal NARS become 0 volt to turn off a MOS transistor 21a.

A page buffer group 13 applies an H level (level of the power supply voltage VCC) as data "1" or an L level (0 volt) as data "0" to each bitline BL. This will be described in detail later. Thus, the selected memory block BLC precharges channels of transistors constituting nonvolatile memory cells MC serially connected to each NAND cell string NA according to the voltage level applied to the bitline BL.

Thereafter, the switch 14s of the row decoder 14 applies a program voltage Vpgm to one of wordlines WL0-WL4 (the one wordline being a wordline whose position is indicated by a page address PA and is referred to here as a selected wordline Word). In a nonvolatile memory cell MC to which data "0" is provided, electrons are injected from a channel maintained at a voltage level of 0 volt to a floating gate to shift a threshold voltage in a positive direction, thereby writing the data "0".

In a nonvolatile memory cell MC to which data "1" is provided, electron injection and threshold voltage fluctuation do not occur and the data "0" or "1" is retained.

Except for a selected wordline Word0 among the wordlines WL0-WL4, the other wordlines (referred to here as unselected wordlines Word) are supplied with a write inhibit voltage Vpass. Thus, electron injection and threshold voltage fluctuation do not occur and the data "0" or "1" is retained in a nonvolatile memory cell MC connected to the unselected memory cells Word.

On the other hand, in the unselected memory cell blocks BLC, the selected transistor SG1 is turned off. Therefore, a channel of a nonvolatile memory cell MC serially connected to each NAND cell string NA is not precharged and voltage levels of the wordlines WL0-WL4 each become a floating voltage. Accordingly, the threshold voltage of the nonvolatile memory cell MC does not fluctuate and the data "0" or "1" is retained.

The switch 14s in the column decoder 14 makes an internal word signal GWL, an internal selection gate signal GSSL, and an internal selection gate signal GSGL become 0 volt. However, the column decoder 14 is maintained at voltage levels of the respective block selection signals BLKSEL. In addition, the control circuit 20 makes a selection signal NARS becomes a high level (hereinafter referred to as H level) to turn on a MOS transistor 21a.

In a write verify operation mode subsequent to the write operation mode, the page buffer group 13 applies an H level to each bitline BL. The switch 14s in the column decoder 14 applies a voltage of 0 volt to the selected wordline Word and applies a read voltage Vread to the unselected wordline Word.

Accordingly, a NAND cell string NA including a nonvolatile memory cell MC into which the data "0" is not written, among nonvolatile memory cells MC into which the data "0" or "1" must be written during a read operation, forms a current path to a ground and a voltage level of its bitline becomes 0 volt.

Meanwhile, a cell string NA including a nonvolatile memory cell MC into which the data "0" is written does not form a current path and a voltage level of its bitline is maintained at the H level.

As it will be described later, in the former case, a latch LT of a page buffer PB stores FAIL data indicating that data of a nonvolatile memory cell MC is not properly written. In the latter case, the latch stores PASS data indicating that data of a nonvolatile memory cell MC is properly written.

In the above-described write operation, the data "1" is supplied from the page buffer PB. Therefore, a NAND cell string NA including a nonvolatile memory cell MC retaining the data "1" forms a current path to a ground and a voltage level of its bitline becomes 0 volt, similar to a NAND cell string NA including a nonvolatile memory cell MC into which data "0" is not written.

However, in this case, as it will be described later, the latch LT of the page buffer PB stores the PASS data indicating that the data of the nonvolatile memory cell MC is properly written.

Block Selection in Erase Verify Operation

In an erase stress operation mode (erase operation), the row decoder 14 outputs a block selection signal BLKSEL of a write inhibit voltage Vpass to the transfer transistor group 21 of a selected one of the memory cell blocks BLC with reference to a block address BA. A block selection signal BLKSEL of 0 volt is output to the other unselected memory cell blocks BLC.

Thus, a voltage generated by the voltage generation circuit 16 is supplied only to the selected memory cell block BLC from the switch 14s in the row decoder 14.

The switch 14s in the row decoder 14 outputs an internal word signal GWL of 0 volt and internal selection gate signals GSSL and GSGL of a write inhibit voltage Vpass to the transfer transistor group 21. Since the transfer transistor group 21 of the selected memory cell block BLC remains in an ON state, the selection gate signal SSL and the selection gate signal SGL input to the selected memory cell block BLC become a floating voltage flowing from the write inhibit voltage Vpass by a threshold voltage of a transfer transistor. The voltage level of the wordlines WL0-WL4 input to the selected memory cell block BLC becomes 0 volt.

Then, the control circuit 20 makes a selection signal NARS become 0 volt and turns off a MOS transistor 21a to supply a common source line CSL with a floating voltage. The voltage generation circuit 16 applies a high voltage (e.g., 20 volts) to a P-well where all blocks including the memory cell block BLC are formed. Thus, in the selected memory cell block BLC, electrons are drawn out of a floating gate to change a threshold voltage of all nonvolatile memory cells MC to a negative voltage and set all the nonvolatile memory cells MC to a data retention state of data "1" (erased state).

Meanwhile, in the unselected memory cell block BLC, the voltage level of the wordlines WL0-WL4 is a floating voltage. Therefore, a floating gate of a nonvolatile memory cell MC is also boosted and thus electrons are not drawn out of the floating gate. That is, a threshold voltage of the nonvolatile memory cell MC does not fluctuate and the nonvolatile memory cell MC is kept at the data retention state of data "0" or data "1".

The switch 14s in the column decoder 14 outputs the internal selection gate signal GSSL of 0 volt and the internal selection gate signal GSGL of 0 volt.

The voltage generation circuit 16 makes a voltage of the P-well return to an original voltage (e.g., 0 volt or negative voltage). The control circuit 20 makes the selection signal NARS become an H level and turns on the MOS transistor 21. The control circuit 20 makes the common source line CSL maintained at the 0 volt.

In the erase verify operation mode (erase verify operation), the page buffer group 13 applies a high level (H level) to each bitline BL. The row decoder 14 outputs a block selection signal BLKSEL of a voltage, which is higher than the write inhibit voltage Vpass by a threshold voltage of a transfer transistor, to a transfer transistor group 21 of a selected block BLC. Also the row decoder 14 outputs a block selection signal BLKSEL of 0 volt to an unselected block BLC. The switch 14s in the row decoder 14 supplies the write inhibit voltage Vpass to the internal selection gate signal GSSL and the internal selection gate signal GSGL. Thus, the selection gate signal GSSL and the selection gate signal GSGL input to the selected memory cell block BLC become the write inhibit voltage Vpass. The voltage level of the wordlines WL0-WL4 input to the selected voltage generation circuit 16 is in a sate of 0 volt. On the other hand, a selection gate signal SSL input to the unselected memory cell block BLC becomes 0 volt by a logical inverted signal /BLKSEL of the block selection signal BLKSEL, similar to the write operation and the write verify operation.

In a write verify operation mode subsequent to the write operation mode, the page buffer group 13 applies an H level to each bitline BL. The switch 14s in the column decoder 14 applies a voltage of 0 volt to the selected wordline Word and applies a read voltage Vread to the unselected wordline Word.

Accordingly, a NAND cell string NA including nonvolatile memory cells MC into which the data "1" is written forms a current path to a ground and a voltage level of its bitline becomes 0 volt. Meanwhile, a cell string NA including even a single nonvolatile memory cell MC into which the data "0" is not written does not form a current path and a voltage level of its bitline is maintained at the high level (H level).

As it will be described later, in the former case, a latch LT of a page buffer PB stores PASS data indicating that data of a nonvolatile memory cell MC is properly written. In the latter case, the latch stores FAIL data indicating that data of a nonvolatile memory cell MC is not properly written.

Since the selection gate signal SSL input to the unselected voltage generation circuit 16 is 0 volt, the NAND cell string NA is not connected to the bitline BL and does not form a current path to a ground.

Block Selection in Read Operation

In a read operation mode (read operation), the row decoder 14 outputs a block selection signal BLKSEL of a voltage level, which is higher than the write inhibit voltage Vpass by a threshold voltage Vpass of a transfer transistor, to the transfer transistor group 21 of a selected memory cell block BLC with reference to a block address BA. The row decoder 14 outputs a block selection signal BLKSEL of 0 volt to the other unselected memory cell block BLC.

Thus, an output of the switch 14s is input to only the memory cell block BLC.

A selection gate signal SSL input to the unselected memory cell block BLC is fixed to 0 volt by an N-channel MOS transistor MTN having a gate to which a logical inverted signal /BLKSELK of a block selection signal BLKSEL output by the row decoder 14 is input. In addition, voltage levels of the selection gate signal SGL and the wordlines WL0-WL4 input to the unselected memory cell block BLC each become a floating voltage to turn off the transfer transistor group 21. The control circuit 20 makes the selection signal NARS become an H level and turns on the MOS transistor 21a. The control circuit 20 makes the common source line CSL maintained at 0 volt.

The page buffer group 13 applies a high level (H level) to each bitline BL. The switch 14s in the row decoder 14 applies a voltage of 0 volt to a selected wordline Word and applies a read voltage Vread to an unselected wordline Word. Thus, in a write operation of a nonvolatile memory cell MC to which the selected wordline Word is connected, a NAND cell string NA to which the data "1" is written forms a current path and a voltage level of its bitline becomes 0 volt.

In a write operation of a nonvolatile memory cell MC to which a selected wordline is connected, a NAND cell string NA to which the data "0" is written does not form a current path to a ground and a voltage level of its bitline is maintained at a high level (H level). As it will be described later, a page buffer outputs data "0" or data "1" according to the voltage level of a bitline.

Since a selected gate signal SSL input to the unselected memory cell block BLC is 0 volt, the NAND cell string NA is not connected to a bitline BL and a read voltage of the bitline BL does not fluctuate.

Next, the detailed configuration and operation of the page buffer group 13 shown in FIG. 1 will now be described with reference to FIGS. 4 to 10.

Figure 4:
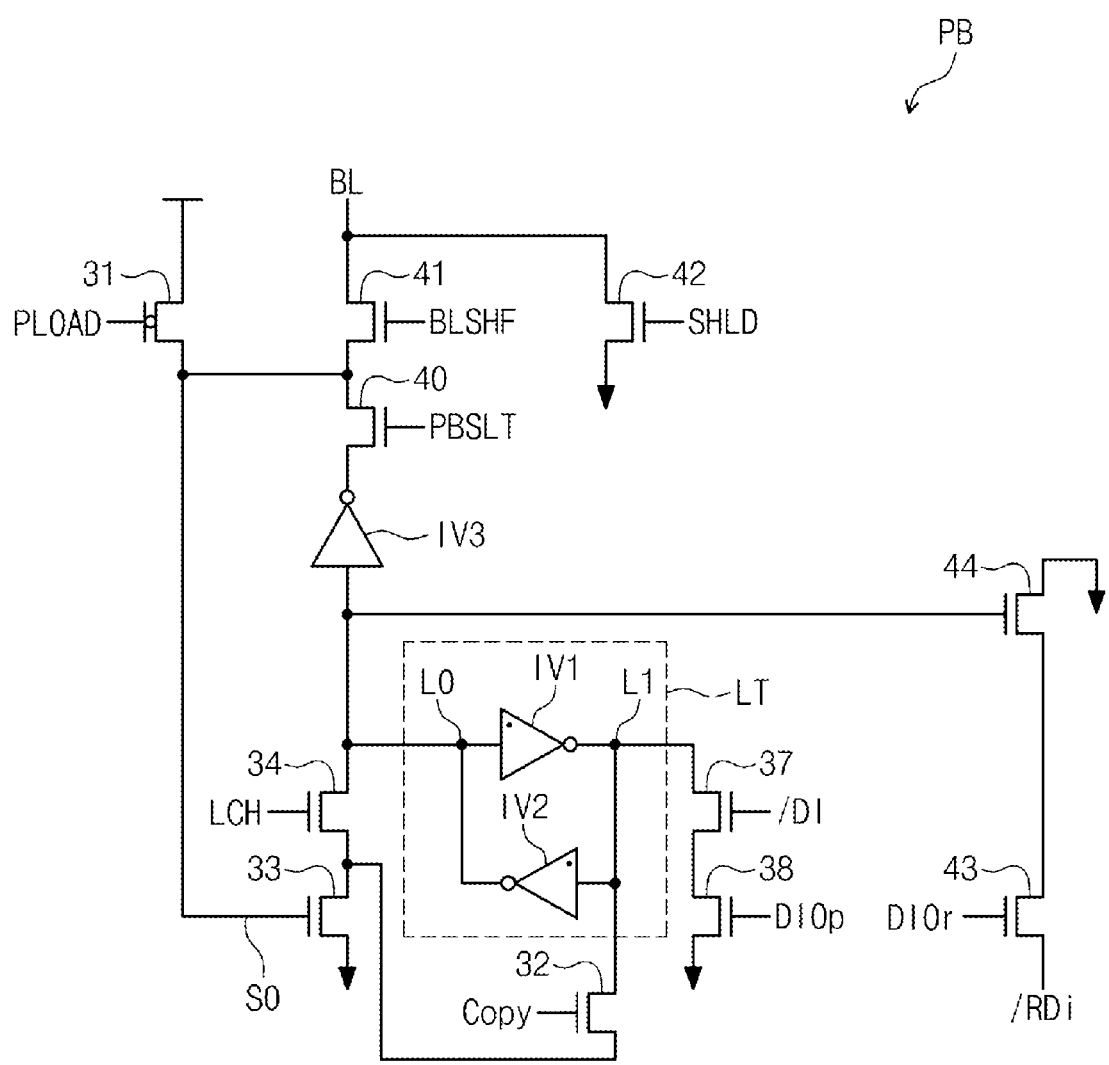
FIG. 4 illustrates an example of a circuit configuration of a page buffer in the page buffer group shown in FIG. 1.

FIG. 4 illustrates an example of a circuit configuration of one page buffer PB in the page buffer group 13 shown in FIG. 1.

In this embodiment of the inventive concepts, a column decoder 15 decodes a p-bit column address indicating a position of an externally input bitline and outputs $2^p$ (=q) row address signals. If a bit number of data externally input to the input/output circuit (I/O) circuit 17 is represented by w, the number of bitlines BL is w×q.

A page buffer PB is provided to correspond to each of the bitlines BL.

The bit number w is set to 1 in this embodiment of the inventive concepts, and a data write line /DI and a data read line /RDi are commonly connected to a page buffer PB of a page buffer group 13.

A column address signal DIOp is a signal input to the page buffer PB during a write operation, and a column address signal DIOr is a signal input to the page buffer PB during a read operation. That is, the column decoder 15 outputs the column address signal DIOp corresponding to an externally input column address, inputting data of the data write line /DI to the page buffer PB. In addition, the column decoder 15 outputs the column address signal DIOr corresponding to an externally input column address, reading data from the page buffer PB to the data read line /RDi.

Since each of the page buffers PB of the page buffer group have the same configuration, a circuit configuration of only one page buffer PB will be described hereinafter.

The page buffer PB includes transistors 31, 32, 33, 34, 37, 38, 40, 41, 42, 43, and 44, a latch LT, and an inverter IV3.

The transistor 31 is a P-channel metal oxide semiconductor (MOS) transistor, while the transistors 32-44 are N-channel MOS transistors.

The latch LT includes inverters IV1 and IV2. An output terminal of the inverter IV1 is connected to an input terminal of the inverter IV2 at a connection point L1, and an input terminal of the inverter IV1 is connected to an output terminal of the inverter IV2 at a connection point L0.

The transistor 31 has a source connected to a power source line, a gate connected to a control signal PLOAD, and a drain connected to a connection point SO.

The transistor 32 has a drain connected to the connection point L1, a gate connected to a control signal COPY, and a source connected to a drain of the transistor 33.

The transistor 33 has a drain commonly connected to the source of the transistor 32 and a source of the transistor 32, a gate connected to a connection point SO, and a source grounded.

The transistor 34 has a drain connected to the connection point L0, a gate connected to a control signal LCH, and the source connected to a drain of the transistor 33.

The transistor 37 has a drain connected to a connection point L1, a gate connected to a data write line /DI, and a source connected to a drain of the transistor 38.

The transistor 38 has a drain connected to the source of the transistor 37, a gate connected to a row address signal DIOp, and a source grounded.

The transistor 40 has a drain connected to the connection point SO, a gate connected to a control signal PBSLT, and a source connected to an output terminal of the inverter IV3. The inverter IV3 has an input terminal connected to the connection point L0.

The transistor 41 has a drain connected to a bitline BL, a gate connected to a control signal BLSHF, and a source connected to the connection point SO.

The transistor 42 has a drain connected to the bitline BL, a gate connected to a control signal SHLD, and a source grounded.

The transistor 43 has a drain connected to the data read line /RDi, a gate connected to the column address signal DIOr, and a source connected to a drain of the transistor 44.

The transistor 44 has a drain connected to the source of the transistor 43, a gate connected to the connection point L0, and a source grounded.

FIG. 5 is a table illustrating states of connection points L0 and L1 of a latch LT in each operation mode of data stored in a nonvolatile memory cell, and FIGS. 6 to 10 are operation timing diagrams of a page buffer PB for each operation mode.

Read Operation

A read operation will be described with reference to FIG. 5 and the timing diagram of FIG. 6.

During the read operation, data indicating reading is input externally and a read mode data is set to a command register 18. Thus, a control circuit 20 outputs a control signal according to the data. In the initial state, the control circuit 20 makes control signals LCH, COPY, PBSLT, and BLSHF become a low level (herein after referred to L level) and makes a control signal PLOAD become an H level.

The column decoder 15 outputs column address signals DIOp and DIPr of L level.

When data is read from a nonvolatile memory cell MC, the control circuit 20 makes a control signal SHLD become an H level to turn on the transistor 42 and shift a voltage level of a bitline BL to a ground level.

The control circuit 20 makes the control signal PLOAD become an L level to shift the control signal COPY to the H level, forcibly applying L-level data to the connection point L1 and performing a reset operation for reading data from the nonvolatile memory cell MC. Thus, H-level data is written into the connection point L0 and L-level data is written into the connection point L1 to store reset data.

The control circuit 20 shifts the control signal COPY to L level and turns off the transistor 32. The control circuit 20 terminates the reset processing with data setting (RESET STATE).

The control circuit 20 shifts the control signal BLSHF to H level.

Thus, the transistor 41 becomes an ON state, and the bitline BL is precharged to H level through the transistors 31 and 41.

The row decoder 14 selects one of the memory cell blocks BLC and applies a voltage of 0 volt to a selected wordline Word of the selected memory cell block BLC. The row decoder 14 applies a read voltage Vread generated by the voltage generation circuit 16 to the unselected wordlines WL to turn on the nonvolatile memory cell MC whose gate is connected to the unselected wordline Word.

As a result, when data "0" is written into the nonvolatile memory cell MC connected to the selected wordline Word, the nonvolatile memory is turned off and the bitline BL is maintained at H level to become an ON state.

On the other hand, when data "1" is written into the nonvolatile memory cell MC, the nonvolatile memory cell MC becomes an ON state and the bitline BL shifts to L level to make the transistor 33 become an ON state.

The control circuit 20 shifts the control signal LCH to H level to turn on the transistor 34.

Figure 6:
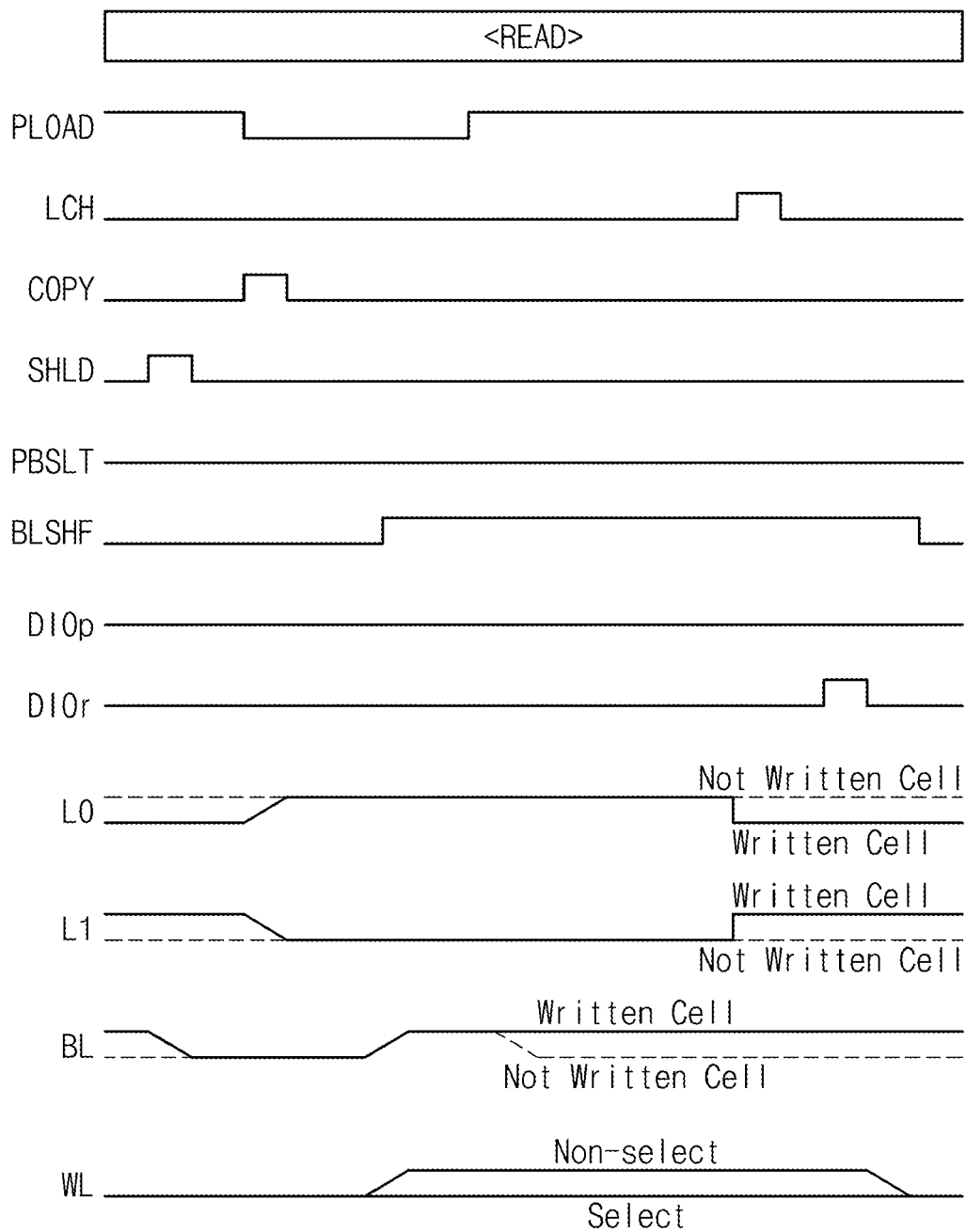
FIG. 6 is a timing diagram illustrating an operational example of a page buffer during a data read operation.

When the data "0" is written into the nonvolatile memory cell MC, a voltage level of the connection point L0 shifts to L level due to current flowing through the transistors 33 and 34, as shown in FIG. 6. In addition, a voltage level of the connection point L1 becomes H level.

When the nonvolatile memory cell MC is in an erased state or a threshold voltage is a negative voltage although data "0" is written into the nonvolatile memory cell MC, current does not flow to a ground point and the connection point L0 is maintained at H level, as shown in FIG. 6. Similarly, a voltage level of the connection point L1 is also maintained at L level.

Next, the control circuit 20 precharges the data read line /RDi to H level.

After the precharge is completed, the column decoder 15 makes the column address signal DIOr become H level to select a page buffer PB corresponding to an input address.

Thus, the transistor 43 becomes an ON state. When data "0" is written into the nonvolatile memory cell MC, the data read line /RDi becomes an H level state such that the connection point L0 becomes L level and the transistor 44 becomes an OFF state. The I/O circuit 17 outputs H-level data to an external entity as data "0" (Read_Pass in FIG. 5).

When data "1" is written into the nonvolatile memory cell MC, the data read line /RDi becomes L level such that the connection point L0 becomes H level and the transistor 44 becomes an ON state. The I/O circuit 17 outputs L-level data to an external entity as data "1".

During a write operation, data "1" is read (Read_Pass and Read_Fail in FIG. 5) when the data "1" is written into the nonvolatile memory cell MC (originally in an erased state) and the nonvolatile memory cell MC is in the erased state although data "0" is written thereinto.

Erase Verify Operation

Figure 7:
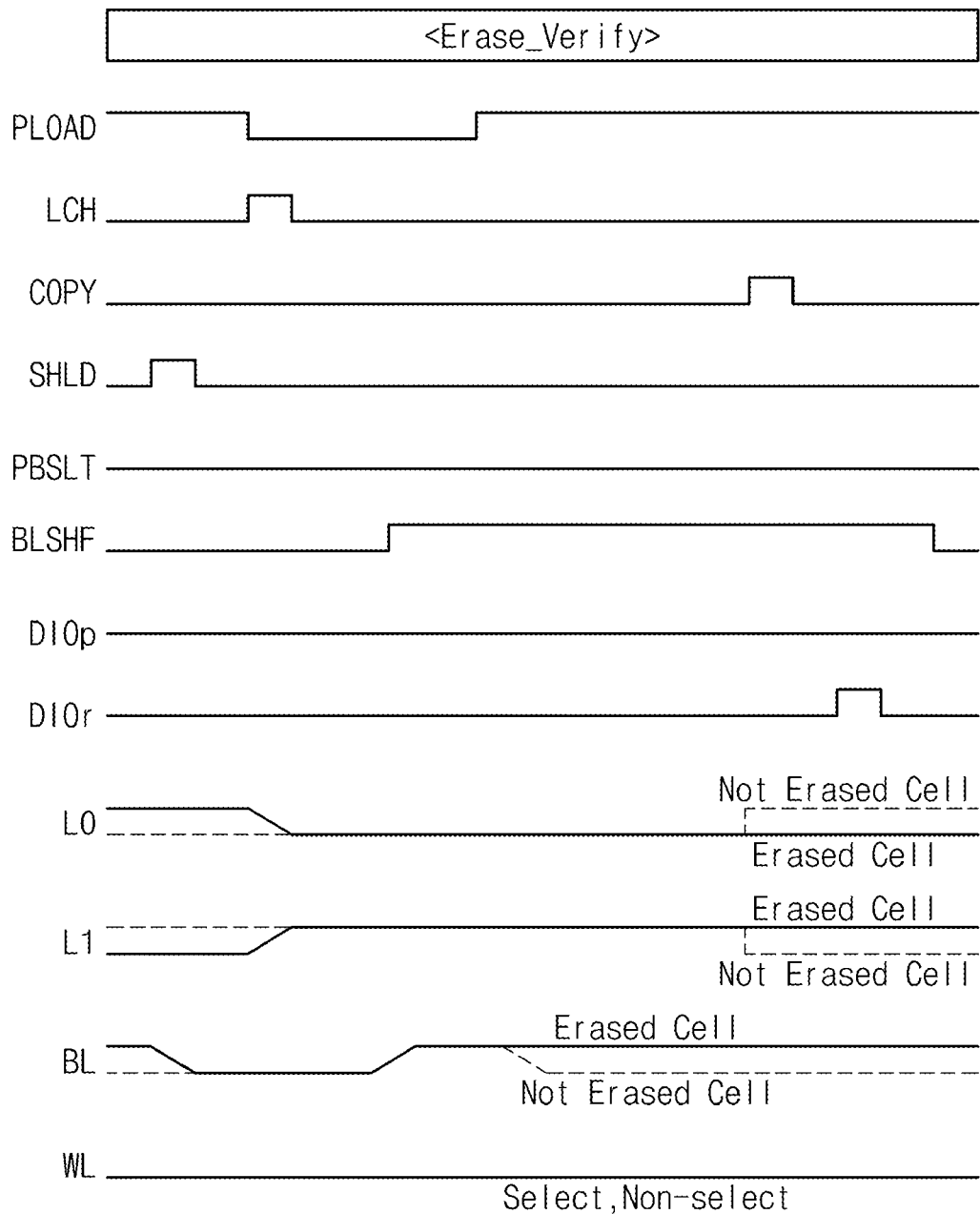
FIG. 7 is a timing diagram illustrating an operational example of a page buffer during an erase verify operation.

An erase verify operation will now be described with reference to FIG. 5 and the timing diagram in FIG. 7. During the erase verify operation, all nonvolatile memory cells of the selected voltage generation circuit 16 are erased and it is determined whether data is properly erased, in the unit of a memory cell block BLC.

Command data is externally input to perform an erase operation in the unit of blocks and erase mode data is set to a command register 18. According to the erase mode data, the control circuit 20 generates an erase voltage for erasing data of a nonvolatile memory cell to the memory cell block BLC and applies the erase voltage to a nonvolatile memory cells MC of a selected block BLC6 (apply a stress for erase).

Thus, as described above, all the nonvolatile memory cells of the block BLC6 applied with the erase voltage are erased in a batch.

After the selected block BLC6 is erased, data for erase verify mode is set to the command register 18. The control circuit 20 outputs a control signal to control each circuit according to the data for erase verify mode. In the initial state, the control circuit 20 makes the control signals LCH, COPY, SHLD, PBSLT, and BLSHF become L level and makes the control signal PLOAD become H level.

The row decoder 15 makes the column address signals DIOp and DIOr become an L level.

The control circuit 20 shifts the control signal SHLD to an H level and makes a voltage level of a bitline BL become a ground level.

The control circuit 20 shifts the control signal PLOAD to L level and shifts the control signal LCH to H level, making he transistors 33 and 34 become an ON state and performing a write reset operation to forcibly write L-level data into the connection point L0 of the latch LT. Thus, L-level data is written into the connection point L0 of the latch LT and H-level data is written into the connection point L1 of the latch LT, as shown in FIGS. 7 and 5.

The control circuit 20 shifts the control signal LCH to L level to make the transistor 34 become an OFF state and terminates the reset processing with data setting (RESET STATE) shown in FIG. 5. The control circuit 20 shifts the control signal BLSHF to H level.

Thus, the transistor 41 becomes an ON state to precharge the bitline BL to H level through the transistors 31 and 41.

The control circuit 20 controls the row decoder 14 to supply a write inhibit voltage Vpass to internal selection gate signals GSSL and GSGL and supply a voltage of 0 volt to an internal word signal GWL.

In the selected block BLC6, input selection gate signals SSL and SGL become the write inhibit voltage Vpass and a NAND cell string NA is connected to a bitline. Also in the selected block BLC6, a wordline WL is supplied with a voltage of 0 volt irrespective of whether it is a selected wordline Word or an unselected wordline Word.

Thus, when nonvolatile memory cells of a NAND cell string NA connected to a bitline BL are in an ON state, the NAND cell string NA becomes a conductive state and the bitline BL becomes a ground level (i.e., L level).

When any one of the nonvolatile memory cells MC of the NAND cell string NA connected to the bitline does not erase the written data "0", the nonvolatile memory cell MC does not become an ON state. Therefore, the NAND cell string NA becomes a nonconductive state and the bitline BL is maintained at a precharged state (i.e., H level).

When the bitline BL is maintained at the H level by writing the data "0" into the nonvolatile memory cell MC, the connection point SO becomes an H level state. When the nonvolatile memory cell MC is erased to shift the bitline BL to an L level, the connection point SO shifts from H level to L level.

Next, the control circuit 20 shifts the control signal COPY to an H level to make the transistor 32 become an ON state.

Thus, when data "0" is erased in all the nonvolatile memory cells MC of the NAND cell string NA, the voltage level of the connection point SO is in an L level state, the connection point L0 of the latch LT is in an L level state, and the connection point L1 is in an H level state.

On the other hand, when data is not erased in any one of the nonvolatile memory cells MC of the NAND cell string NA, the voltage level of the connection point is in an H level state, the connection point L0 of the latch LT is in an H level state, and the connection point L1 is in an L level state.

The data, which indicates whether the data "0" is erased in all the nonvolatile memory cells MC of the NAND cell string NA of the selected block BLC6, is read to latches LT of all the page buffers PB through the bitlines BL. The control circuit 20 precharges the data read line /RDi to an H level.

After the precharging is terminated, the column decoder 15 makes the column address signal DIOr become an H level to select a page buffer PB corresponding to an input address.

Thus, the transistor 43 becomes an ON state. When data "0" is erased in all the nonvolatile memory cells MC of the NAND cell string NA, the data read line /RDi becomes an H level to make the connection point L0 become an "L" state and make the transistor 44 become an OFF state. H-level data is input to the control circuit 20 (EraseVerify_Pass in FIG. 5).

On the other hand, when data is not erased in any one of the nonvolatile memory cells MC of the NAND cell string NA, the data read line /RDi becomes an L level state to make the connection point L0 becomes an H level state and make the transistor 44 become an ON state. Data of the L level is input to the control circuit 20 (EraseVerify_Fail in FIG. 5).

This data read operation is performed by sequentially changing column addresses. That is, the column decoder 15 sequentially changes row address signals DIOr generated from the column addresses and selects one of the page buffers PB to repeatedly read data from a latch LT of the selected page buffer PB.

When signals read from all the page buffers to the data read line /RDi are all in an H level, the control circuit 20 determines that data erasure is properly completed and terminates the erase operation. On the other hand, when any one of the signals read from the data read line /RDi is in an L level, a re-erase operation and an another erase verify operation are performed.

The erase verify operation following the re-erase operation is performed by resetting data stored in the latch of the page buffer PB. The erase verify operation following the re-erase operation makes the connection point L0 become an L level state and makes the connection point L1 become an H level (reset state). Thus, the erase operation and the erase verify operation are performed until the control circuit 20 determines that the data erase operation is properly completed or reaches a predetermined number of attempts.

Write Operation

A write operation will now be described with reference to FIG. 5 and the timing diagram in FIG. 8. During the write operation, data is written into a latch LT of a page buffer PB from a data write line /DI, and data "0" or "1" is written in a nonvolatile memory cell by using the written data.

During the write operation, command data indicating a write operation is externally input, write operation mode data is set to the command register 18, and the control circuit 20 outputs a control signal to control each circuit according to the write operation mode data. In the initial state, the control circuit 20 makes the control signals LCH COPY, SHLD, PBSLT, and BLSHF become an L level state and makes the control signal PLOAD become an H level state.

The column decoder 15 makes the column address signals DIOp and DIOr become an L level state.

The control circuit 20 shifts the control signal PLOAD to an L level and shifts the control signal LCH to an H level. Thus, the transistor 31 becomes an ON state and the connection point SO becomes an H level to make the transistor 33 become ON state. Since the transistor 34 becomes the ON state, data of "L' level is applied to the connection point L0 to perform a reset operation for writing data into a nonvolatile memory cell MC. As a result, the connection point L0 of the latch LT becomes an L level state and the connection point L1 becomes an H level state to store data during the reset operation.

The control circuit 20 shifts the control signal PLOAD to an H level and shifts the control signal LCH to an L level to make the transistors 31 and 34 become an OFF state. The reset operation is terminated with data setting shown in FIG. 8 (RESET STATE in FIG. 5).

The column decoder 15 outputs the column address signal DIOp to make the transistor 38 become an ON state.

Next, the control circuit 20 controls the I/O circuit 17 to write external data "1" or external data "1" into the nonvolatile memory cell MC. The I/O circuit 17 makes a data write line /DI become an H level and an L level corresponding to the external data "1" or the external data "1".

When an H level is applied to the data write line /DI to write the data "0", the connection point L0 of the latch LT becomes an H level state and the connection point L1 becomes an L level state. Meanwhile, when an L level is supplied to the data write line /DI to write the data "1", the connection point L0 of the latch LT is in the L level state and the connection point L1 is in the H level state. This allows the initial state to be maintained (INHIBIT STATE in FIG. 5).

Also during the write operation, writing data into the latch LT of the page buffer PB is performed by sequentially changing column addresses. That is, the column decoder 15 sequentially changes column address signals DIOp generated from the column addresses and selects one of the page buffers PB to write data into a latch LT of the selected page buffer PB.

The control circuit 20 makes control signals PBSLT and BLSHF become an H level.

Thus, the transistors 40 and 41 become an ON state. In addition, a bitline BL connected to a NAND cell string NA of a nonvolatile memory cell MC into which data "0" is to be written is maintained at 0 volt, while a bitline BL connected to a NAND cell string NA of a nonvolatile memory cell MC into which data "1" is to be written (into which the data "0" is not written) is precharged to an H level.

The row decoder 14 selects one of blocks BLC6 and supplies a program voltage Vpgm to a selected wordline Word of the selected block BLC6. In addition, the row decoder 14 supplies a write inhibit voltage Vpass to all the unselected wordlines Word except for the selected wordline Word.

Thus, source, drain, and channel portions of the nonvolatile memory cell MC connected to the selected wordline Word and in which the data "0" is to be written are in the L level, and electrons are injected into a floating gate of the nonvolatile memory cell MC to increase a threshold voltage. As a result, the data "0" is written thereinto.

In addition, source, drain, and channel portions of the nonvolatile memory cell MC into which the data "1" is to be written are in the H level and electrons are not injected into a floating gate of the nonvolatile memory cell MC and the data "1" is maintained.

The row decoder 14 shifts the selected wordline Word and the unselected wordline Word to 0 volt to terminate the write operation.

Write Verify Operation

Figure 8:
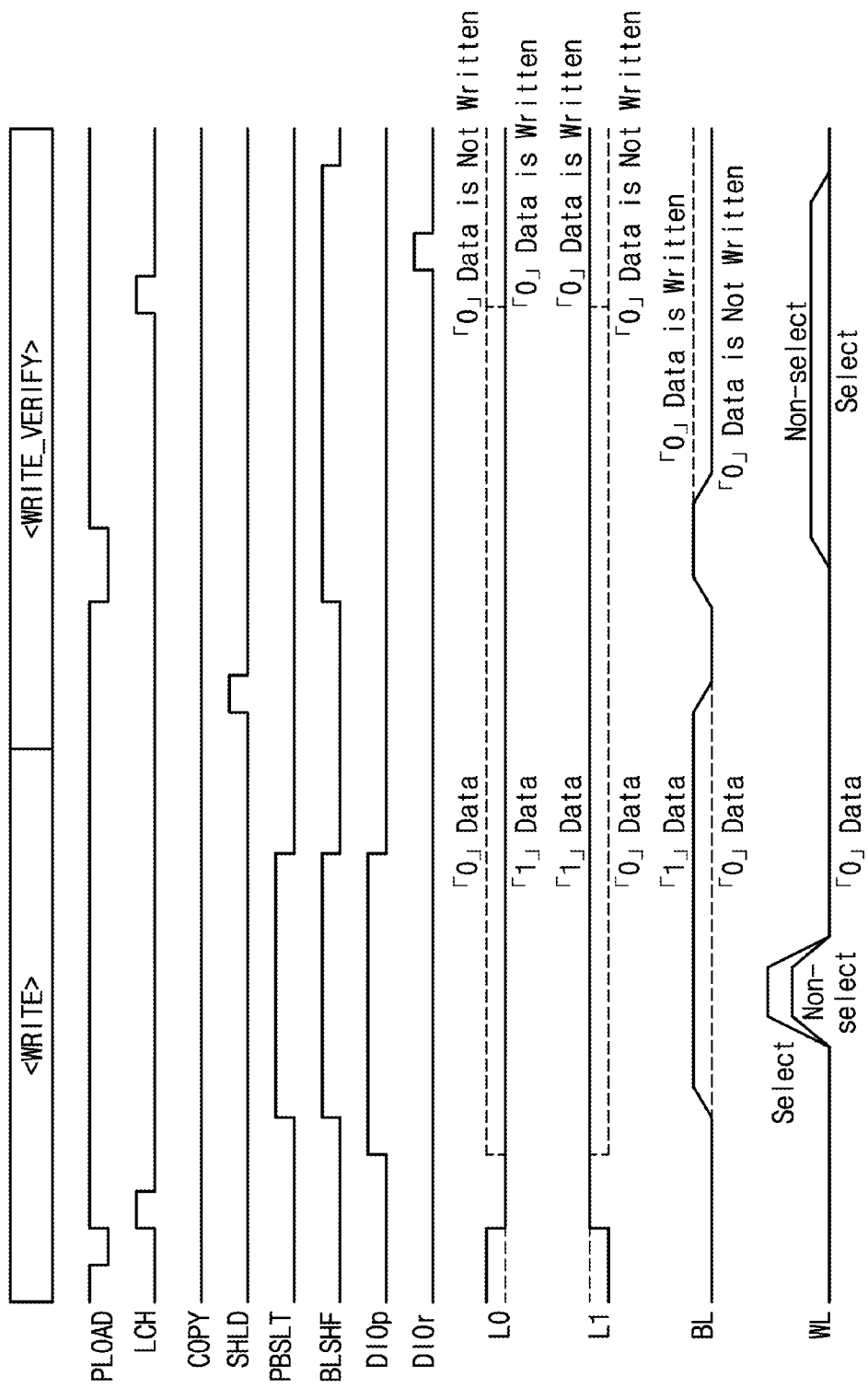
FIG. 8 is a timing diagram illustrating an operational example of a page buffer during a data write operation.

Still referring to FIGS. 5 and 8, during a write verify operation, the control circuit 20 reads data from a nonvolatile memory cell MC to the page buffer PB to determine whether data is properly written into a memory cell (write verify operation: Verify1).

That is, when the data is read from the nonvolatile memory cell MC, the control circuit 20 makes a control signal SHLD become an H level and makes the transistor 42 become an ON state to shift a voltage level of the bitline BL to a ground voltage level.

Also the control circuit 20 makes a control signal SHLD become an L level and shifts the control signal PLOAD to an L level to shift the control signal BLSHF to an H level.

Thus, the transistor 42 becomes an OFF state while transistors 31 and 41 become an ON state. The bitline BL is precharged to an H level through the transistors 31 and 41.

The row decoder 14 applies a voltage of 0 volt to the selected wordline Word and applies a read voltage Vread generated by the voltage generation circuit 16 to all the unselected wordline Word except for the selected wordline Word, making all nonvolatile memory cells MC whose gates are connected to the unselected wordlines Word become an ON state.

In the case that the data "0" is stored in a nonvolatile memory cell MC whose gate is connected to the selected wordline Word, the bitline BL is not discharged and is maintained at the H level. On the other hand, in the case that the data "1" is stored in the nonvolatile memory cell MC (in case of an erased state or in the case that a threshold voltage is a negative voltage although the data "0" is written), the bitline BL is discharged to become an L level.

Next, the control circuit 20 shifts the control signal LCH to an H level to make the transistor 34 become an ON state.

Thus, when data "0" is written into a nonvolatile memory cell MC into which the data "0" is to be written, the connection point SO is in an H level state. Therefore, the connection point L0 of the latch LT shifts to an L level and the connection point L1 shifts to an H level.

In the case that data "0" is not written into a nonvolatile memory cell MC into which the data "0" is to be written, the connection point SO is in an L level state. Therefore, the latch LT is not inverted and the connection point L0 of the latch LT, the connection point L1, and the latch LT are maintained at the H level, the L level, and a state (opposite to RESET STATE), respectively.

In case of a nonvolatile memory cell MC into which the data "1" is written, the connection point SO is maintained at the initial state although it becomes the L level. Therefore, the connection point L0 of the latch LT, the connection point L1, and the latch LT are maintained at the L level, the H level, and the reset state, respectively.

After data of a nonvolatile memory cell MC in which a wordline WL of the selected block BLC6 is commonly used is read to latches LT of all the page buffers PB, the control circuit 20 precharges the data read line /RDi to the H level.

After the precharge operation is terminated, the column decoder 15 outputs a column address signal DIOr of H level to select a page buffer PB corresponding to an input address.

Thus, the transistor 43 becomes an ON state. When the data "0" is written into the nonvolatile memory cell MC, the data read line /RDi is maintained at the H level state to make the connection point L0 become an L level and make the transistor 44 become an OFF state. H-level data is input to the control circuit 20 (WriteVerify_Pass in FIG. 5).

During the write operation, in the case that data "0" is not written into the nonvolatile memory cell MC although the data "0" was written thereinto, the data read line /RDi becomes an L level to make the connection point L0 become an H level and make the transistor 44 become an ON state. L-level data is input to the control circuit 20 (WriteVerify_Fail in FIG. 5).

When the data "1" is written into the nonvolatile memory cell MC, the data read line /RDi is maintained at the H level state to make the connection point L0 become an L level and make the transistor 44 become an OFF state. H-level data is input to the control circuit 20 (WriteVerify_Pass in FIG. 5).

The write verify operation Verify1 is performed by sequentially changing column addresses. That is, the column decoder 15 sequentially changes row address signals DIOr generated from the column addresses, selects one of the page buffers PB, and repeatedly performs a data read operation from a latch LT of the selected page buffer PB to the data read line /RDi.

When a signal read from all the page buffers PB to the data read line /RDi is in an H level, the control circuit 20 determines that the data writing is properly completed and terminates the write verify operation.

When one of the signals read to the data read line /RDi is in an L level, the write operation and the write verify operation are performed again. During the write verify operation, the write and the write verify operation are re-performed without resetting data of a latch LT of a page buffer PB. During the write verify operation continuing to be performed during the write operation, the connection point L0 becomes an L level and the connection point L1 becomes an H level (RESET STATE). This write verify operation is repeatedly performed until the control circuit 20 determines that the data writing is properly completed or reaches a predetermined number.

Over-program Verify Operation

An over-program (or over-write) verify operation (Verfiy2) will now be described with reference to FIG. 5 and the timing diagram shown in FIG. 9. The over-program verify operation is performed to determine whether, after writing data into a nonvolatile memory cell is properly completed, there is an over-programmed cell in nonvolatile memory cells into which data is written.

Similar to the above-described read operation, the over-program verify operation data is read from a nonvolatile memory cell MC in the unit of pages. The red data is written into a latch LT. The written data is output to the data read line /RDi. Unlike the read operation, the over-program verify operation continues to be performed during the write verify operation Verify1 without externally inputting command data. Although a voltage of 0 volt is supplied to a selected wordline Word during the read operation, a read voltage (>Vread) higher than the read voltage Vread supplied to an unselected wordline Word is supplied to a selected wordline Word during the over-program verify operation. A nonvolatile memory cell maintained at an OFF state even when the read voltage (>Vread) is supplied is determined to be an over-programmed cell.

If it is determined that the data wiring is properly completed, the control circuit sets over-program verify mode data to the command register 18 and outputs a control signal for controlling each circuit according to the over-program verify mode data. In the initial state, the control circuit 20 makes control signals LCH, COPY, SHLD, PBSLT, and BLSHF become an L level and makes a control signals PLOAD become an H level.

The column decoder 15 make column address signals DIOp and DIPr become an L level.

When data is read from a nonvolatile memory cell MC, the control circuit 20 outputs a control signal SHLD of H level and makes the transistor 42 become an ON state to shift a voltage of the bitline BL to a ground voltage level.

The control circuit 20 shifts the control signal PLOAD to the L level and the control signal COPY to the H level to perform a reset operation in which L-level data is forcibly applied to the connection point L1 to read data from the nonvolatile memory cell MC. Thus, H-level data is written into the connection point L0 of the latch LT and L-level data is written into the connection point L1, and reset data is stored.

The control circuit 20 shifts the control signal COPY to an L level and makes the transistor 32 become an OFF state to terminate the reset operation with the data stetting (RESET STATE) shown in FIG. 5.

In addition, the control circuit 20 shifts the control signal BLSHF to an H level.

Thus, the transistor 41 becomes an ON state and the bitline BL is precharged to the H level through the transistors 31 and 41.

The row decoder 14 selects one of the blocks BLC6 and a high voltage (>Vread) higher than the read voltage Vread to a selected wordline Word of the selected block. In addition, the row decoder 14 applies a read voltage Vread generated by the voltage generation circuit 16 to all the unselected wordline Word except for the selected wordline WL. Thus, all the nonvolatile memory cells MC whose gates are connected to the unselected wordlines Word becomes an ON state.

As a result, data "0" is written into a nonvolatile memory cell MC connected to the selected wordline Word. When a threshold voltage is higher than the read voltage (>Vread), the nonvolatile memory cell MC and the bitline BL are maintained at an H level state and the transistor 33 is maintained at the ON state.

When the threshold voltage is lower than the read voltage (>Vread) although the data "0" is written into the nonvolatile memory cell MC connected to the selected wordline Word or when the data "1" is written into the nonvolatile memory cell MC connected to the selected wordline Word, the nonvolatile memory cell MC becomes an ON state and the bitline shifts to an L level to make the transistor 33 become an OFF state.

The control circuit 20 shifts the control signal LCH to an H level and makes the transistor 34 become an ON state.

Figure 9:
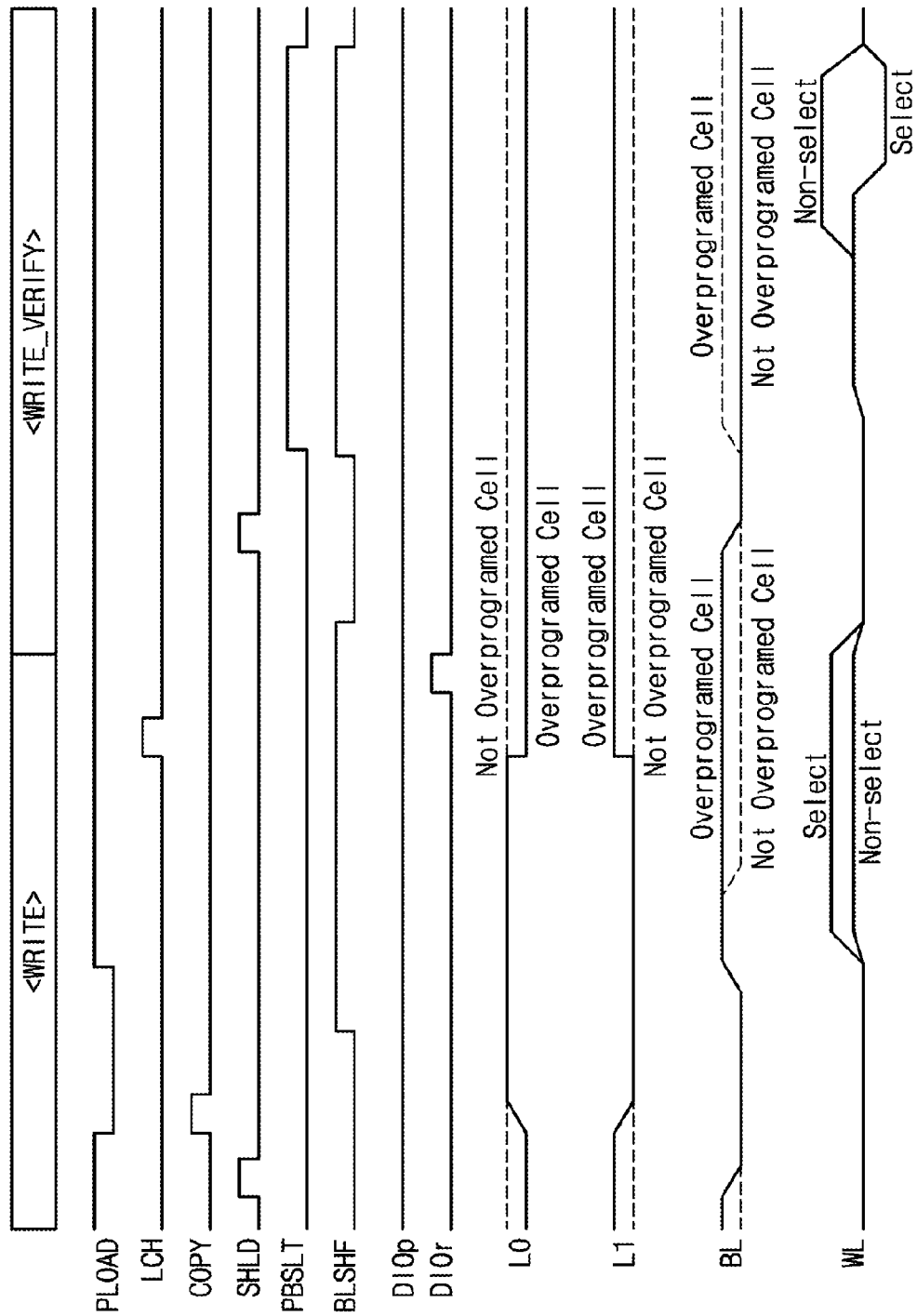
FIG. 9 is a timing diagram illustrating an operational example of a page buffer during an over-program-verify and cure operation.

When the data "0" is written into the nonvolatile memory cell MC and the threshold voltage is higher than the read voltage (>Vread), a voltage level of the connection point L0 shifts to an L level through the transistors 33 and 34, as shown in FIG. 9. Further, a voltage level of the connection point L1 shifts to an H level.

When the threshold voltage is lower than the read voltage (>Vread) although the nonvolatile memory cell MC is in an erased state or the data "0" is written into the nonvolatile memory cell MC, current does not flow to a ground point and the connection point L0 is maintained at an H level, as shown in FIG. 9. Similarly, the connection point L1 is also in an L level state.

Next, the control circuit 20 precharges the data read line /RDi to an H level.

After the precharge operation is terminated, the row decoder 15 outputs a column address signal DIOr of H level to select a page buffer PB corresponding to an input address.

Thus, the transistor 43 becomes an ON state. When the data "0" is written into the nonvolatile memory cell MC and the threshold voltage is higher than the read voltage (>Vread), the data read line /RDi is in an H level state to make the connection point L) be in an L level and make the transistor 44 be in an OFF state. H-level data is input to the control circuit 20 (Pass shown in FIG. 5).

When the threshold voltage is lower than the read voltage (>Vread) although the data "0" is written, the data read line /RDi becomes at an L level to make the connection point L0 be in an H level and make the transistor 44 be in an ON state. L-level data is input to the control circuit 20 (Fail shown in FIG. 5).

When the nonvolatile memory cell MC is in an erased state, the data read line /RDi is in an L level state to make the connection point be in an H level and make the transistor 44 be in an ON state. L-level data is input to the control circuit 20 (Fail shown in FIG. 5).

A data read operation is performed by sequentially changing column addresses. That is, the column decoder 15 sequentially changes column address signals DIOr generated from the column addresses, selects one of the page buffers PB, and repeatedly reads data from a latch LT of the selected page PB.

When all signals read from the page buffer PB to the data read line /RDi are in an L level, the control circuit PB determines that there is an over-programmed cell in a selected page and terminates the over-program verify operation. Since there is an over-programmed cell when one of the signals read to the data read line /RDi is in an H level, the control circuit 20 performs a write operation, a write verify operation, and an over-program verify operation after performing a cure operation and a copy operation described below.

Cure Operation

Next, a cure operation will now be described with reference to FIG. 5 and the timing diagram in FIG. 9. During the cure operation, data stored in a latch L is written into a nonvolatile memory cell MC after the termination of the over-program verify operation Verify2.

Similar to the above-described write operation, data is written into a nonvolatile memory cell MC during the cure operation. However, unlike the write operation, an over-program verify operation Verify2 is continuously performed when command is not input externally and there is an over-programmed cell. In addition, a reset operation of a latch LT is not performed to use data previously stored in the latch LT during the over-program verify operation Verify2. While a program voltage Vpgm is supplied to a selected wordline Word during the write operation, a write voltage Vneg lower than 0 volt is supplied to a selected wordline Word during the cure operation. The write voltage Vneg is supplied to a memory cell and an over-programmed cell is weakly erased to lower a threshold voltage of the over-programmed cell (shift in a negative direction).

During the cure operation, when it is determined that there is an over-programmed cell, the control circuit 18 sets cure operation mode data to the command register 18 and outputs a control signal to control each circuit according to the cure operation mode data. In the initial state, the control circuit 20 makes control signals LCH, COPY, SHLD, PBSLT, and BLSHF become an L level and makes a control signal PLOAD become an H level.

The control circuit 20 makes a control signal SHLD become an H level and makes the transistor 42 become an ON state to shift a voltage level of the bitline BL to a ground voltage level.

The control circuit 20 makes control signals PBSLT and BLSHF become an H level.

Thus, the transistors 40 and 44 become an ON state and a bitline BL connected to a NAND cell string NA of a nonvolatile memory cell which is in an over-programmed state becomes an H level. On the other hand, a bitline BL connected to a NAND cell string NA of an over-programmed nonvolatile memory cell MC (a nonvolatile memory cell MC whose threshold voltage is lower than a read voltage or a nonvolatile memory cell MC into which data "1" is written although a write operation of data "0" is performed) becomes 0 volts.

The row decoder 14 selects one of the blocks BLC6 and supplies a read voltage Vread to all wordlines Word (including the selected wordline Word and unselected wordlines Word). Similar to the write operation, a low voltage VL is supplied to a wiring of a selected gate signal SSL and a voltage of 0 volt is supplied to a selected gate signal SGL.

Thus, a channel, a source, and drain of each memory cell disposed in a NAND cell string NA including a nonvolatile memory cell MC that is connected to the selected wordline Word and is in an over-programmed state become a floating state. On the other hand, a channel, a source, and a drain of each memory cell disposed in a NAND cell string NA including a nonvolatile memory cell MC that is connected to the selected wordline Word and is not over-programmed become 0 volt.

Thereafter, the row decoder 14 applies a write inhibit voltage Vpass to the unselected wordline Word. Thus, except for a channel of a selected memory cell in a string, a channel, a source, and a drain of a NAND cell string NA including a nonvolatile memory cell MC that is in an over-programmed state are induced to a high voltage Vcouple due to coupling to an unselected wordline Word and a channel applied with a write inhibit voltage Vpass. On the other hand, for except for a channel of a selected memory cell in a string, a channel, a source, and a drain of a NAND cell string NA including a nonvolatile memory cell MC that is not over-programmed are fixed to 0 volt. And then, the row decoder 14 applies a write voltage Vneg to a selected wordline Word.

Figure 11:
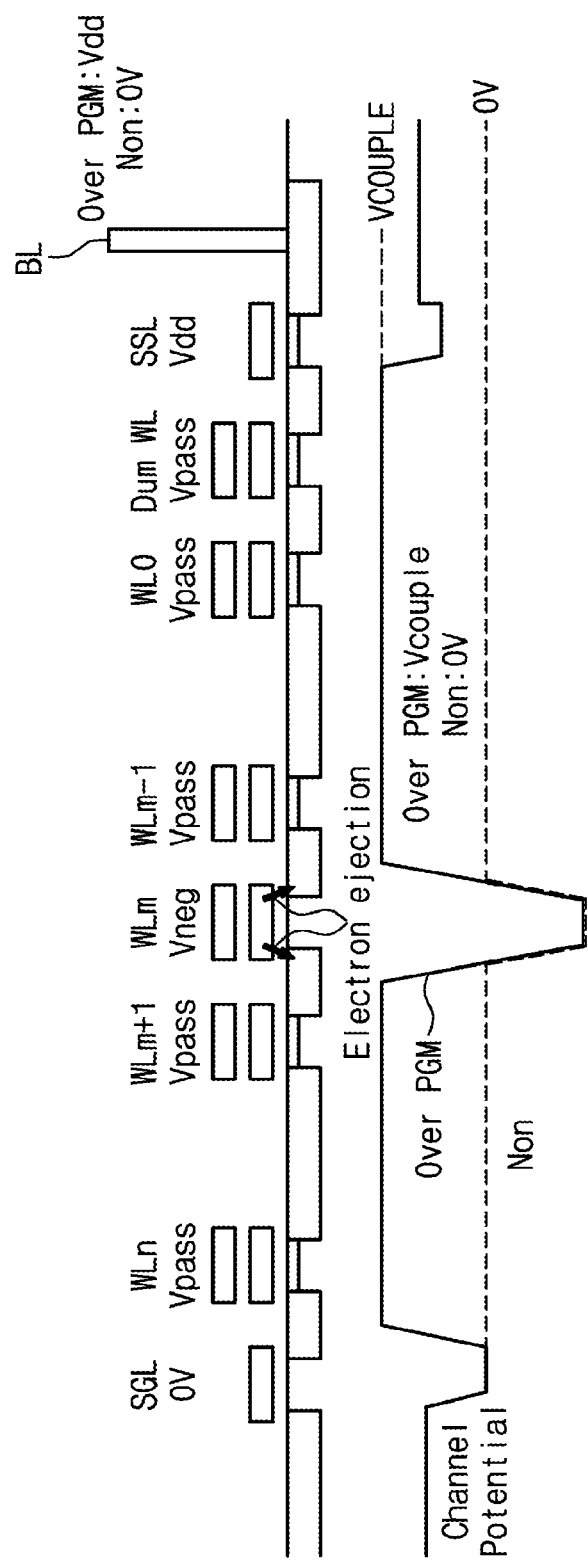
FIG. 11 is a schematic cross-sectional view of a NAND cell string for use in describing a channel potential of a memory cell transistor during the cure operation illustrated in FIG. 9 or 10.

FIG. 11 is a schematic diagram illustrating a channel potential in a NAND cell string in the above state. More specifically, FIG. 11 is a vertical sectional view of a NAND cell string NA including a selection transistor taken in a wordline direction and illustrates a channel potential of each channel.

As illustrated in FIG. 11, in a NAND cell string that includes an over-programmed cell, a potential directly below a channel of a selected memory cell is Vneg and a potential of a channel, a source, and a drain of another memory cell is VCOUPLE (dotted line).

In a NAND cell string that does not include an over-programmed cell, a potential directly below a channel of a selected memory cell is Vneg and a potential of a channel, a source, and a drain of another memory cell is 0 volt (broken line).

In a nonvolatile memory cell MC that is in an over-programmed, electrons are ejected from a floating gate to a source and a drain due to a negative voltage (Vneg— VCOUPLE) applied between the source and the drain to decrease a threshold voltage of the nonvolatile memory cell MC. In a nonvolatile memory cell MC that is not over-programmed, electrons are not ejected from a floating gate to a source and a drain and a threshold voltage of the nonvolatile memory cell MC does not decrease. That is, since an over-programmed cell is weakly erased but cells, except for an over-programmed cell, in the same page are not erased, an erase stress is not applied thereto.

Copy Operation

A copy operation is described next with reference to FIG. 5 and the timing diagram of FIG. 10.

After the cure operation is performed, the copy operation is automatically performed. This is because data of a nonvolatile memory cell MC is rewritten into a latch of a page buffer PB to determine whether data is correctly written into a memory cell during the cure operation, through a write verify operation Verify1 and an over-program verify operation.

Similar to the above-described read operation, data from a nonvolatile memory cell MC is written into a latch in the unit of pages during the copy operation. However, unlike the read operation, command data is not input externally and the copy operation is continuously performed following the cure operation. Similar to the write operation and the write verify operation, the connection point L0 becomes an L level and the connection point L1 becomes an H level to subsequently perform a write verify operation Verify1. Similar to the read operation, the selected wordline Word is supplied with a voltage of 0 volt and the unselected wordline Word is supplied with a read voltage Vread.

After the cure operation is completed, the control circuit 20 sets copy operation mode data to the command register 18 and outputs a control signal to control each circuit according to the copy operation mode data. In the initial state, the control circuit 20 makes control signals LCH, COPY, SHLD, PBSLT, and BLSHF become an L level and makes a control signal PLOAD become an H level.

When data is read from a nonvolatile memory cell MC, the control circuit 20 makes a control signal SHLD become an H level and makes the transistor become an ON State to shift a voltage level of the bitline BL to a ground voltage level.

The control circuit 20 shifts the control signal PLOAD to an L level and shifts the control signal LCH to an H level, forcibly applying L-level data to the connection point L0 and performing a reset operation for reading data from the non-volatile memory cell MC. Thus, L-level data is written into the connection point L0 and H-level data is written into the connection point L1 to store reset data.

The control circuit 20 shifts the control signal LCH to an L level and makes the transistor 34 become an OFF state to terminate a reset operation.

Continuously, the control circuit 20 shifts the control signal BLSHF to an H level.

Thus, the transistor 41 becomes an ON state and the bitline BL is precharged to an H level through the transistors 31 and 41.

The row decoder 14 selects one of the blocks BLC6 and makes a selected wordline of the selected block BLC6 become 0 volt. In addition, the row decoder 14 applies a read voltage Vread generated by the voltage generation circuit 16 to all the unselected wordline Word, except the selected wordline WL, and makes all the nonvolatile memory cells MC whose gates are connected to the unselected wordline Word become an ON state.

As a result, when data "0" is written into the nonvolatile memory cell MC connected to the selected wordline Word (not in an erased state), the nonvolatile memory cells in an OFF state, the bitline BL is an H level state, and the transistor 33 is in an ON state.

On the other hand, when data "1" is written into the nonvolatile memory cell MC (in an erased state), the nonvolatile memory cell MC becomes an ON state, the bitline BL shifts to an L level, and the transistor 33 becomes an OFF state.

The control circuit 20 shifts the control signal COPY to an H level and makes the transistor 32 become an ON state.

Figure 10:
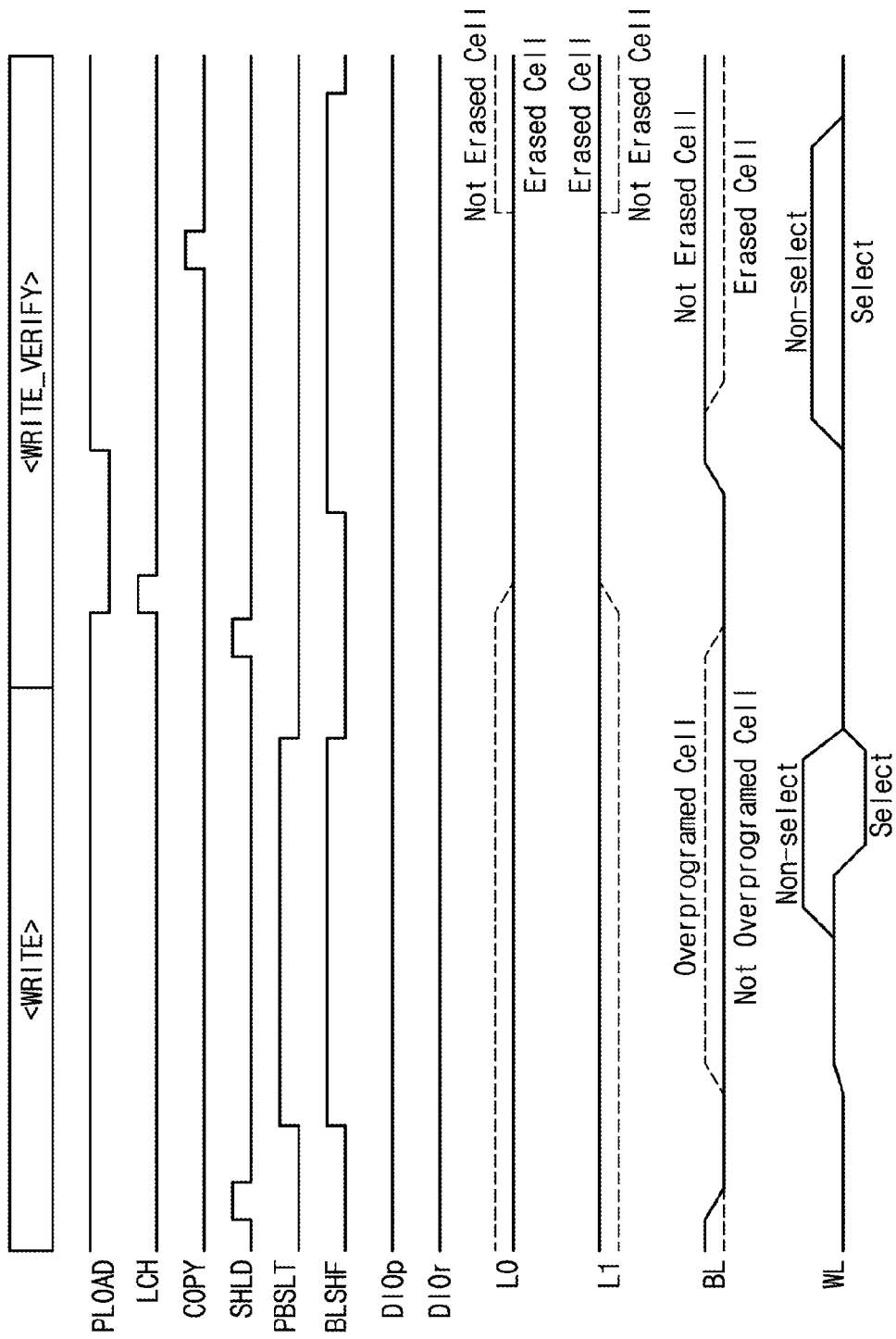
FIG. 10 is a timing diagram illustrating an operational example of a page buffer during a cure operation and a copy operation.

While the data "0" is written into the nonvolatile memory cell MC, a voltage level of the connection point L1 shifts to an L level due to current flowing to the transistors 33 and 32, as shown in FIG. 10. Further, a voltage level of the connection point L0 becomes an H level.

While the data "1" is written into the nonvolatile memory cell MC (in an erased state), current does not flow to a connection point and the connection point L0 is in an L level state, as shown in FIG. 10. Similarly, the voltage level of the connection point L1 is in an H level state.

As described above, while the data "0" is written into the nonvolatile memory cell MC, the connection point L0 becomes the H level and the connection point L1 becomes the L level to make data of a latch LT becomes the state before the data "0" is written. On the other hand, while the data "1" is written into the nonvolatile memory cell MC, the connection point L0 becomes the L level and the connection point L1 becomes the H level to make the data of the latch LT become the reset state (write inhibit, i.e., INHIBIT state) before the data "1" is written during the write operation.

Figure 12:
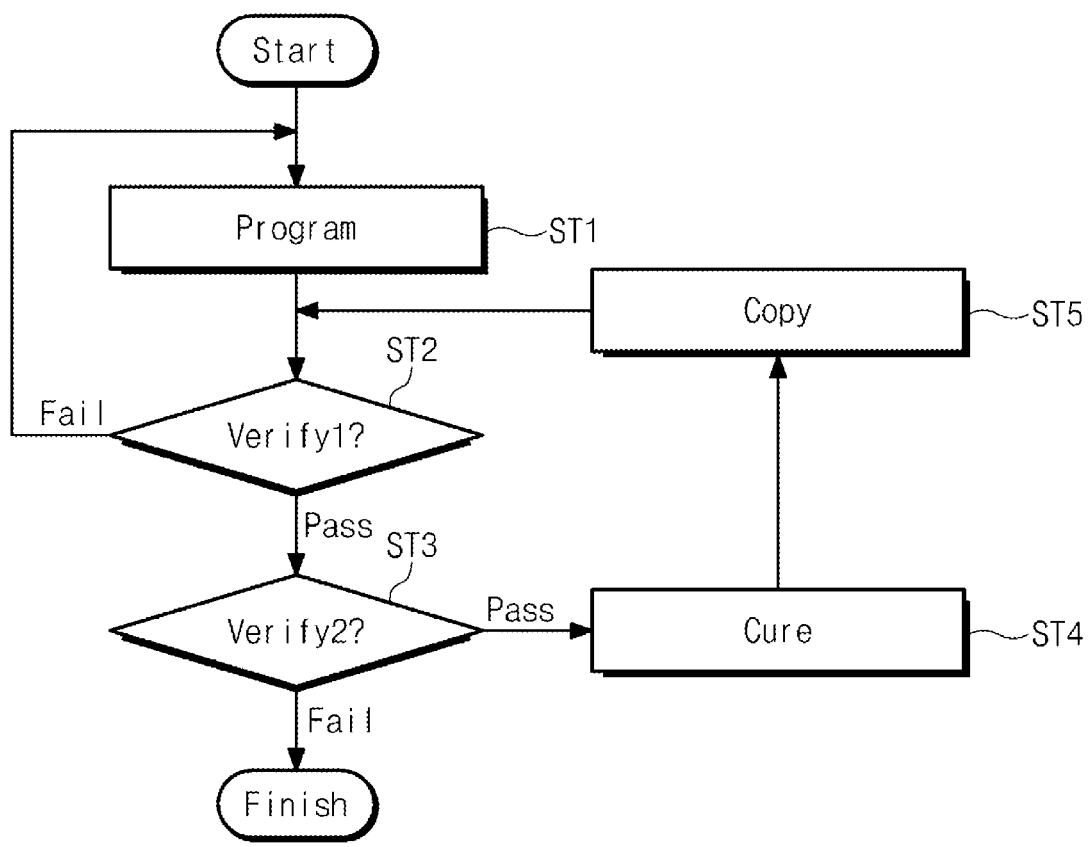
FIG. 12 is a flowchart illustrating an example of a data write operation of a nonvolatile semiconductor memory device according to an embodiment of the inventive concepts.

FIG. 12 is a flowchart illustrating an operation example of a data write process of a nonvolatile semiconductor memory device according to an embodiment of the inventive concepts. The data write process will now be described more fully hereinafter with reference to FIGS. 5 and 12. Command data indicating writing of external data is written into the command register 18, and the control circuit 20 carries out the data write process according to the command data.

In step ST1, the program operation control circuit 20 resets a page buffer PB to make the connection point L0 become an L level and makes the connection point L1 become an H level.

The column decoder 15 outputs a control signal from the control circuit 20 to a column address signal DIOp and connects the data line /DI and the page buffer PB to each other.

The I/O circuit 17 makes the data line /DI maintained at the H level when external write data is data "0" and makes the data line /DI becomes the L level when the external write data is data "1". Accordingly, the write data of the latch LT is set.

When the write data is the data "0", the connection point L0 becomes an H level and the connection point L1 becomes an L level and is set opposite to the reset state. On the other hand, when the write data is the data "1", the connection point L0 becomes the L level and the connection point L1 becomes the H level is set the same as the reset state (write inhibit state).

The control circuit 20 shifts the control signal PBSTL and BLSHF to an H level. When the data written into the latch LT is the data "0", the control circuit 20 precharges the bitline BL to the L level. When the data written into the latch LT is the data "1", the control circuit 20 precharges the bitline BL to the H level.

By the control circuit from the control circuit 20, the row decoder 14 supplies a low voltage VL (being a power supply voltage VCC or lower) to a selection gate signal SSL and supplies a voltage of 0 volt to a selection gate signal SGL. The row decoder 14 makes the selection transistor SG1 become an ON state and makes the transistor SG2 become an OFF state. Thus, a channel of each NAND cell string is supplied with a voltage of 0 volt when the data is the data "0" and supplied with the H level to be in a floating state when the data is the data "1".

Continuously, the row decoder 14 supplies a program voltage Vpgm to the selected wordline Word and supplies a write inhibit voltage Vpass to the unselected wordline Word. Thus, electrons are injected from a channel into a nonvolatile memory cell MC into which the data "0" is to be written, among the nonvolatile memory cells MC connected to the selected wordline Word, to write the data "0" thereinto. In addition, the electrons are not injected from the channel and a nonvolatile memory cell MC into which the data "1" is to be written (memory cell MC in the erased state) retains the data "1".

In step ST2, a write verify operation is performed to determine whether data is correctly written into the nonvolatile memory cell MC.

After making the control circuit SHLD become an H level and making the bitline BL become an L level, the control circuit 20 makes the control circuit PLOAD become the L level and makes the control signal BLSHF become the H level to precharge the bitline BL to the H level.

By the control signal from the control circuit 20, the row decoder 20 supplies a write inhibit voltage Vpass to the selection signals SSL and SGL to make the transistors SG1 and SG2 become an ON state. In addition, the row decoder 14 supplies a voltage of 0 volt to the selected wordline Word and supplies a read voltage Vread to the unselected wordline Word. Thus, when data "0" is not written into a nonvolatile memory cell MC connected to the selected wordline Word (when rise in threshold voltage decreases and data "0" is not written into a nonvolatile memory cell MC although the data "0" is to be written thereinto or in case of an erased state in which data "1" is originally memorized), a NAND cell string NA including a corresponding memory cell forms a current path to a ground and a bitline BL becomes an L level. On the other hand, when the data "0" is written into the nonvolatile memory cell MC connected to the selected wordline Word (a threshold voltage rises to a defined value in a nonvolatile memory cell into which the data "0" must be written), a NAND cell string NA including a corresponding memory cell does not form a current path to a ground and the bitline BL is maintained at an H level.

The control circuit 20 makes the control circuit LCH become an H level. Thus, when the data "0" is written into the nonvolatile memory cell MC, the connection points L0 and L1 of the latch LT become an L level and an H level, the same as in the reset state, respectively. When the data "1" is written into the nonvolatile memory cell MC (in case of a cell into which the data "0" is not be written), the connection points L0 and L1 of the latch LT are maintained at the same levels (L level and H level, respectively) as in the reset state. When the data "0" is not written into a nonvolatile memory cell MC into which the data "0" is to be written, the connection points L0 and L1 of the latch LT are maintained at initial data setting states (H level and L level, respectively) as the same logic.

The column decoder 15 outputs a column address signal DIOr by a control signal from the control circuit 20 and connects the data read line /RDi and the page buffer PB to each other.

Thus, the control circuit 20 receives a signal of L level from a page buffer PB, where data writing into a memory cell fails, through the data read line /RDi and receives a signal of H level from a page buffer PB, where data writing into a memory cell passes, through the data read line /RDi.

When an H-level signal is input from all the page buffers PB, the control circuit 20 determines that data writing is successful and sets data for proceeding to an over-program verify operation to the command register 18 to proceed to an over-program verify operation (step ST3) (step ST2—Pass).

When an L-level signal is input from one of the page buffers PB, the control circuit 20 determines that data writing fails and returns to the write operation (step ST1). The page buffer PB performs a rewrite operation on data written previously into the latch LT (step ST2—Fail).

In step ST3, an over-program verify operation Verify2 is performed to determine whether the nonvolatile memory cell MC is over-programmed.

After making the control signal SHLD become an H level and making the bitline BL become an L level, the control circuit 20 makes the control signal PLOAD become an L level and makes the control signal COPY become an H level. Thus, similar to the read operation, the connection point L0 of the latch LT becomes an H level and data of L level is stored in the connection point L1.

Continuously, the control circuit 20 makes the control signal BLSHF become an H level and precharges the bitline BL to an H level.

By the control signal from the control circuit 20, the row decoder 14 supplies a write inhibit voltage Vpass to the selection gate signals SSL and SGL and makes the selection transistors SG1 and SG2 become an ON state. In addition, the row decoder 14 supplies a voltage (>Vread) higher than the read voltage Vread to a selected wordline Word and supplies the read voltage Vread to the unselected wordline Word. Thus, when a nonvolatile memory cell MC connected to the selected wordline Word is not over-programmed (when the nonvolatile memory cell is not over-programmed because the data "0" is written during the write operation or in case of an erased state in which the data "1" is originally memorized), a NAND cell string including a corresponding memory cell forms a current path to a ground and the bitline BL becomes an L level. On the other hand, when the nonvolatile memory cell MC connected to the selected wordline Word is over-programmed (when the data "0" is written into the nonvolatile memory cell MC but a threshold voltage rises above the read voltage (>Vread)), the NAND cell string NA including a corresponding memory cell does not form a current path to a ground. Therefore, the bitline BL is maintained at an H level.

The control circuit 20 makes the control signal LCH become an H level. Thus, when the data "0" is written into the nonvolatile memory cell MC and the nonvolatile memory cell is not over-programmed, the connection points L0 and L1 of the latch LT are maintained at the same levels as in the reset state (H level and L level, respectively). When the data "1" is written into the nonvolatile memory cell MC (in case of an erased state in which the data "1" is memorized), the connection points L0 and L1 of the latch LT are maintained at the same levels as in the reset state (H level and L level, respectively). When over-programmed is a nonvolatile memory cell MC into which the data "0" is written, unlike in the reset state, the connection points L0 and L1 of the latch LT shift to the L level and the H level, respectively.

The column decoder 15 outputs a column address signal DIOr by a control signal from the control circuit 20 and connects the data read line /RDi and the page buffer PB to each other.

Thus, the control circuit 20 receives a signal of L level from a page buffer PB, where data of a non-over-programmed memory cell is read, through the data read line /RDi and receives a signal of H level from a page buffer, where data of an over-programmed memory cell is read, through the data read line /RDi.

When the signal of L level is input from all the page buffers PB, the control circuit 20 determines that there is no over-programmed cell and terminates the data write process (step ST3—Fail).

When the signal of H level is input from one of the page buffers PB, the control circuit 20 determines that there is at least one over-programmed cell on a page, sets data for proceeding to a cure operation to the command register 18, and perform the cure operation (step ST4) (step ST3—Pass).

In step ST4, the cure operation (which may be considered part of the over-write verify operation) uses the data stored in the latch LT during the over-program verify operation. During the cure operation, weak erasure is performed on the over-programmed nonvolatile memory cell MC (the data "0" remains at the state and a threshold voltage decreases).

After making the control circuit SHLD become an H level and making the bitline BL become an L level, the control circuit 20 makes the control signals PBSLT and BLSHF become an H level.

Thus, the bitline BL connected to the NAND cell string NA including the over-programmed cell becomes the H level and the bitline BL connected to a NAND cell string NA not including an over-programmed cell becomes the L level.

By the control circuit from the control circuit 20, the row decoder 14 supplies a low voltage VL (being a power supply voltage VCC or lower) to a selection gate signal SSL and supplies a voltage of 0 volt to a selection gate signal SGL. The row decoder 14 makes the selection transistor SG1 become an ON state and makes the transistor SG2 become an OFF state. Thus, among NAND cell strings NA, a channel of a NAND cell string NA including an over-programmed cell is applied with an H level and becomes a floating state. On the other hand, a channel of a NAND cell string NA not including an over-programmed cell is applied with a voltage of 0 volt.

Continuously, the row decoder 14 supplies a write inhibit voltage Vpass to the unselected wordline Word. Thus, a high voltage Vcouple is generated at the channel of the NAND cell string NA including the over-programmed cell due to coupling with the write inhibit voltage. Meanwhile, the channel of the NAND cell string NA not including the over-programmed cell is maintained at 0 volt.

Continuously, the row decoder 14 supplies a write voltage to the selected wordline Word. Thus, in the over-programmed cell, a high electric field is added between a control gate and a source/drain and electrons are ejected from a floating gate to a channel (is weakly erased) to decrease a threshold voltage. In a non-over-programmed memory cell, since a high electric field is not applied between a control gate and a source/drain, electrons are not ejected from the floating gate (i.e., weak erasure is not carried out) and a threshold voltage does not fluctuate.

Likewise, during the cure operation, an erase stress is not added to a non-over-programmed nonvolatile memory cell MC on the same page as the over-programmed cell and is added only to the over-programmed cell and its threshold voltage decreases.

Continuously, the control circuit 20 sets data for proceeding to a copy operation to the command register 18 and proceeds to the copy operation (step ST5).

In step ST5, during the copy operation (which may be considered part of the over-write verify operation), the page buffer PB copies data of a nonvolatile memory cell subjected to the cure operation to a latch.

After making the control signal SHLD become an H level and making the bitline BL become an L level, the control circuit 20 makes the control signal PLOAD become an L level and makes the control signal LCH becomes an H level.

Thus, similar to the erase verify operation, the connection point L0 of the latch LT becomes an L level and the connection point L1 stores data of L level.

Continuously, the control circuit 20 makes the control signal BLSHF become an H level and precharges the bitline BL to the H level.

By the control signal from the control circuit 20, the row decoder 14 supplies the write inhibit voltage Vpass to the selection gate signals SSL and SGL and makes the selection transistors SG1 and SG2 become an ON state. In addition, the row decoder 14 supplies the voltage of 0 volt to the selected wordline Word and supplies the read voltage Vread to the unselected wordline Word. Thus, when the data "1" is written into the nonvolatile memory cell MC connected to the selected wordline Word (originally in case of an erased state), a NAND cell string NA including a corresponding memory cell forms a current path to a ground and makes the bitline BL become an L level. On the other hand, when the data "0" is written into the nonvolatile memory cell MC connected to the selected wordline Word (when the nonvolatile memory cell MC is weakly erased although it is over-programmed during the write operation or when the memory cell MC is not over-programmed originally during the write operation and the data "0" is written into the memory cell MC), a NAND cell string including a corresponding memory cell does not form a current path to a ground. Therefore, the bitline BL is maintained at the H level.

The control circuit 20 makes the control signal COPY become an H level. Thus, when the data "0" is written into the nonvolatile memory cell MC, the connection points L0 and L1 of the latch LT shifts, unlike in the reset state, to an H level and an L level, respectively. In addition, when the data "1" is written into the nonvolatile memory cell MC (the data "0" is not to be written thereinto), the connection points L0 and L1 of the latch LT are maintained in the same levels as in the reset state (L level and H level, respectively).

Likewise, by performing the copy operation, a logical state of the latch LT is set to a state before the page buffer writes external data into a memory cell during a write operation.

The control circuit 20 sets write verify mode data to the command register 18 and performs the above-described write verify operation (step ST2).

As described above, in a data write process, a nonvolatile memory device according to the inventive concept detects an over-programmed cell through an over-program verify operation Verify2 although there is an over-programmed memory cell. During a subsequent cure operation, the nonvolatile memory device erases the over-programmed cell in the unit of bits according to the data written into a latch LT of a page buffer PB by over-program verification. Thus, a high electric field stress may be not applied to a non-over-programmed memory cell in the same page to improve reliability of the nonvolatile memory device.

As explained above, during a write operation, a nonvolatile memory device according to the inventive concept detects an over-programmed cell through over-program verification to erase the over-programmed cell in the unit of bits according to data written into a latch of a page buffer. Thus, since a high electric field stress is not applied to a non-over-programmed memory cell (normal memory cell) in the same page, reliability of the nonvolatile memory device can be enhanced.

While the inventive concepts have been particularly shown and described with reference to exemplary embodiments thereof, it will be apparent to those of ordinary skill in the art that various changes in form and detail may be made therein without departing from the spirit and scope of the inventive concepts as defined by the following claims.

What is claimed is:

1. A nonvolatile memory device comprising:
a memory cell array including a plurality of bitlines, a plurality of wordlines, and a plurality of memory cells;
a plurality of page buffers coupled to the respective bitlines of the memory cell array, each page buffer including a latch configured to store data to be written into and read from a memory cell coupled to a respective bitline of the memory cell array; and
a control circuit configured to execute an over-program verify operation which includes detecting an over-programmed memory cell among the plurality of memory cells with reference to pass/fail data stored in the respective latches of the plurality of page buffers, and decreasing a threshold voltage of a detected over-programmed memory cell while maintaining a threshold voltage of memory cells which have not been detected as being over-programmed.

2. The nonvolatile memory device of claim 1, wherein, in the over-program verify operation, each latch of the plurality of page buffers is configured to store pass data indicative of an over-programmed memory cell coupled to a respective bitline, and fail data indicative of the absence of an over-programmed memory cell coupled to the respective bit line.

3. The nonvolatile memory device of claim 2, wherein, in the over-program verify operation, the control circuit supplies a first voltage to a bitline connected to a latch into which the pass data is stored, supplies a second voltage which is lower than the first voltage to a bitline connected to a latch into which the fail data is stored, and supplies a third voltage which is lower than the second voltage to a wordline connected to a detected over-programmed cell.

4. The nonvolatile memory device of claim 3, wherein the control circuit is further configured to terminate the over-write verify operation when the fail data is stored in all the latches of the page buffers.

5. The nonvolatile memory device of claim 2, wherein, after the threshold voltage of a detected over-programmed memory cell is decreased, the control circuit is configured to copy data from the memory cell into the respective latch of the respective page buffer, and to execute a write verify operation according to the data written into the latch.

6. The nonvolatile memory device of claim 5, wherein, after the write verify operation, the control circuit is configured to again execute the over-program verify operation.

7. The nonvolatile memory device of claim 1, wherein the memory cells are NAND electrically erasable and programmable read only memory (EEPROM) cells.

8. A method of operating a nonvolatile memory device, the nonvolatile memory device including memory cell array including a plurality of bitlines, a plurality of wordlines, and a plurality of memory cells, and a plurality of page buffers coupled to the respective bitlines of the memory cell array, each page buffer including a latch configured to store data to be written into and read from a memory cell coupled to a respective bitline of the memory cell array, the method comprising:

executing a write operation in which write data is latched into the respective latches of the page buffers, and then stored in memory cells of bitlines coupled to the pages buffers;

executing a write verify operation to verify proper execution of the write operation, the write verify operation including latching the write data stored in the memory cells into the latches of the page buffers;

executing an over-write verify operation to detect whether the write data subjected to the write verify operation is over-programmed write data, the over-write verify operation including reading pass/fail data stored in the latch circuits of the page buffers; and executing a cure operation in which a threshold voltage of a detected over-written memory cell is reduced while a threshold voltage of memory cells which have not been detected as an over-written memory cell is maintained.

9. The method of claim 8, wherein the write operation, write verify operation, and over-write verify operation are executed in response to a single write command.

10. The method of claim 8, further comprising, before executing the over-write verify operation, repeating the write operation when the write verify operation fails to verify properly execution of a previous write operation.

11. The method of claim 8, wherein the cure operation includes supplying a first voltage to a bitline connected to a latch into which pass data is stored, supplying a second voltage which is lower than the first voltage to a bitline connected to a latch into which fail data is stored, and supplying a third voltage which is lower than the second voltage to a wordline connected to a detected over-programmed cell.

12. The method of claim 11, further comprising executing a copy operation, after the cure operation, in which data of the over-written memory cell is copied into the respective latch of the respective page buffer.

13. The method of claim 12, wherein the method further comprises again executing the write verify operation and the over-write verify operation after the copy operation.

14. The method of claim 8, wherein the memory cells are NAND electrically erasable and programmable read only memory (EEPROM) cells.

\* \* \* \* \*